United States Patent [19]
Tsukada et al.

[11] Patent Number: 5,144,536
[45] Date of Patent: Sep. 1, 1992

[54] ELECTRONIC CIRCUIT SUBSTRATE

[75] Inventors: Kiyotaka Tsukada; Yukihiro Noda, both of Gifu, Japan

[73] Assignee: Ibiden Co., Ltd., Ogaki, Japan

[21] Appl. No.: 556,521

[22] Filed: Jul. 24, 1990

[30] Foreign Application Priority Data

| Aug. 3, 1989 | [JP] | Japan | 1-201757 |
| Aug. 31, 1989 | [JP] | Japan | 1-225951 |
| Sep. 1, 1989 | [JP] | Japan | 1-226585 |
| Sep. 21, 1989 | [JP] | Japan | 1-245952 |
| Sep. 22, 1989 | [JP] | Japan | 1-247048 |

[51] Int. Cl.$^5$ .......................... H05K 1/03; H05K 3/32
[52] U.S. Cl. ................................ 361/402; 361/414; 174/258; 174/260; 29/851; 427/96
[58] Field of Search ............... 361/400, 401, 402, 412, 361/414, 383, 396; 29/846, 851; 174/255, 256, 258, 260; 427/96

[56] References Cited

U.S. PATENT DOCUMENTS

| 3,652,332 | 3/1972 | Brand et al. |
| 4,412,377 | 11/1983 | Nagashima et al. ............ 427/96 X |
| 4,614,837 | 9/1986 | Kane et al. .................... 29/846 X |
| 4,721,831 | 1/1988 | Vora. |
| 4,799,983 | 1/1989 | Desai ............................ 264/62 X |
| 4,882,455 | 11/1989 | Sato et al. |
| 4,940,623 | 7/1990 | Bosna et al. ................... 427/96 X |

FOREIGN PATENT DOCUMENTS

| 0196865 | 10/1986 | European Pat. Off. |
| 0332561 | 9/1989 | European Pat. Off. |
| 2007818 | 3/1969 | Fed. Rep. of Germany. |

OTHER PUBLICATIONS

IBM Technical Disclosure Bulletin, vol. 27, No. 7A, Dec. 1984; "Protective Film Ceramic Substrates", by A. J. Lavin.

Primary Examiner—Leo P. Picard
Assistant Examiner—Paramita Ghosh
Attorney, Agent, or Firm—Oblon, Spivak, McClelland, Maier & Neustadt

[57] ABSTRACT

An electronic circuit substrate excellent in reliability, which comprises a porous ceramic sintered body with film devices such as a conductive circuit, a resistor and a capacitor directly formed on a surface thereof. A resin is filled in the pores of the porous ceramic sintered body, and the bottom surface of the film devices are fit into the pores and recesses on the surface of the porous ceramic sintered body in close contact therewith in a wedged state. A method of producing the aforesaid electronic circuit substrate comprises the steps of forming film devices directly on a surface of a porous ceramic sintered body. Then, filling the pores of the porous ceramic sintered body with a resin so as to fit the under surface of the film devices into the pores and recesses on the surface of the porous ceramic sintered body in close contact therewith in a wedge state.

22 Claims, 13 Drawing Sheets

ELECTRONIC CIRCUIT SUBSTRATE

BACKGROUND OF THE INVENTION

1. Field of the Invention

The present invention relates to an electronic circuit substrate having film devices such as a conductive circuit provided on the surface thereof and which is excellent in reliability.

2. Related Art Statement

Various electronic circuit substrates have recently been known and put to practical use. For example, electronic circuit substrates using glass/epoxy resin composite, alumina sintered body, mullite sintered body or the like have been proposed and practically used. As a method for the promotion of high integration, a method of directly mounting a silicon integrated circuit and the like onto the substrate has been investigated.

However, since the glass/epoxy resin composite is largely different from the silicon integrated circuit in the thermal expansion coefficient, only a very small silicon integrated circuit can be directly mounted on the substrate. In addition, the substrate of the glass/epoxy resin composite is liable to change its size at a circuit formation step, so that it is particularly difficult to apply this substrate to the formation of fine and precise circuits.

An alumina sintered body and a mullite sintered body have a high hardness and, hence, a poor machinability. Therefore, if machining for forming through holes or the like is necessary, after a green shaped body is machined, the machined body is fired. By this method, however, since it is difficult to make the shrinkage uniform at the firing step, it is especially difficult to produce substrates which are required to have a high dimensional accuracy or a large size.

To deal with these problems, Japanese Patent Laid-Open Nos. 287190/1986 and 82689/1989, and U.S. Pat. No. 4,882,455 disclose a substrate of a porous ceramic sintered body with the pores filled with a resin.

In this substrate, the thermal expansion thereof is varied in conformity with the thermal expansion of a part mounted thereon such as a silicon integrated circuit by varying the porosity of the ceramic material. The thermal expansion of this substrate is small, so that the substrate is excellent in dimensional stability. In addition, since machining of the substrate is easy, it can cope with the tendency toward the increase in the size and reduction in the weight of integrated circuits.

For the purpose of high integration, multi-layer electronic circuit substrates produced by laminating a plurality of electronic circuit substrates have recently been widely used. Electronic circuit substrates having film devices such as a resistor and a capacitor provided on the circuit in the form of films in place of chips have been developed. By forming such film devices such as a conductive circuit, resistor and capacitor, it is possible to reduce in the size and weight of an electronic circuit substrate.

However, an electronic circuit substrate produced by forming film devices on the above-described resin-filled porous ceramic substrate is poor in reliability.

More specifically, since the film devices formed on the resin-filled porous ceramic substrate are situated on the resin, the behavior of the resin greatly influences the film devices. For example, the resistance and the capacitance of the film devices inconveniently greatly varies at a high humidity or a high temperature. In addition, since the film devices are formed on the resin surface, the film devices have the possibility of the separation from the resin-filled porous ceramic sintered body.

SUMMARY OF THE INVENTION

Accordingly, it is an object of the present invention to eliminate the above-described problems in the related art and to provide an electronic circuit substrate having excellent high-humidity resistance, high-temperature resistance, and reliability by making the best use of the merits of the above-described substrate of a resin-filled porous ceramic sintered body.

To achieve this aim, the present invention provides an electronic circuit substrate which comprises a porous ceramic sintered body with film devices such as a conductive circuit, a resistor and a capacitor directly formed on the surface thereof; and a resin filled in the pores of the porous ceramic sintered body. The film devices are fit into the pores and recesses on the surface of the porous ceramic sintered body in close contact therewith in a wedged state.

In the electronic circuit substrate of the present invention, film devices such as a conductive circuit are fit into the pores and recesses on the surface of the porous ceramic sintered body in close contract therewith in a wedged state. The pores other than those are filled with a resin.

Further, the present invention also provides a method of producing an electronic circuit substrate, which comprises the steps of forming film devices directly on a porous ceramic sintered body and filling the pores of the porous ceramic sintered body with a resin.

When film devices such as a conductive circuit are formed on the surface of a porous ceramic sintered body, a paste containing particles which constitute the film devices is first applied to the green shaped body of a ceramic material or the like by printing or the like and the green ceramic shaped body is then fired at a temperature for forming a sintered body.

Alternatively, a method of forming film devices by applying the paste on the surface of a porous ceramic sintered body and baking it may be adopted.

There is also a method of forming film devices such as a conductive circuit by deposition, sputtering or the like while masking the surface of a porous ceramic sintered body except the portions which constitute a circuit, and removing the mask thereafter.

In any method, it is important that the porous ceramic sintered body and the film devices are directly in close contact with each other.

When the porous ceramic sintered body and the film devices are directly in close contact with each other, the film devices are very stable even with a change of environment such as temperature or humidity.

The film devices here mean electronic parts formed on the substrate in the form of a film such as a conductive circuit, film resistance and film capacitor.

As a material for the porous ceramic sintered body, a ceramic material containing at least one selected from the group consisting of cordierite, alumina, aluminum nitride, mullite, magnesium titanate, aluminum titanate, silicon dioxide, lead oxide, zinc oxide, beryllium oxide, tin oxide, barium oxide, magnesium oxide and calcium oxide as the main constituent is used. Among these, cordierite is preferable because the thermal expansion coefficient thereof is approximate to that of a silicon integrated circuit.

As the resin used to fill in the pores of the sintered body, an epoxy resin, a polyimide resin, a triazine resin, a polyparabanic acid resin, a polyamide-imide resin, a silicon resin, an epoxy silicon resin, an acrylic acid resin, a methacrylic acid resin, an anylic acid resin, a phenol resin, an urethane resin, a furan resin, and a fluorine resin are usable.

When the pores of the porous sintered body are filled with a resin, a method of dipping a porous sintered body having film devices provided thereon in a hot-molten resin, a method of impregnating the porous sintered body with a resin which is dissolved in a solvent, or a method of polymerizing the porous sintered body which has been impregnated with a resin in a monomer state is adopted.

In the present invention, the average diameter of the pores of the porous ceramic sintered body is preferably 0.2 to 15 $\mu m$. This is because if the average diameter of the pores is less than 0.2 $\mu m$, the adhesion between the film devices and the porous ceramic sintered body is lowered. That is, the wedging effect on the improvement of the adhesion is lowered. On the other hand, if the average pore diameter is more than 15 $\mu m$, the film devices are buried into a considerably deeper portion from the surface of the porous ceramic sintered body, thereby making it difficult to form an electronic circuit substrate with high precision.

In the present invention, the porosity is preferably not less than 10% (volume ratio). This is because if the porosity is less than 10%, the wedging effect is lowered.

The pores of the porous portion of ceramic particles of the porous ceramic sintered body provided with film devices such as a conductive circuit on the surface thereof are filled with a resin.

If the conductive circuit is further plated or connected to another part, it is masked before the resin impregnation so as to prevent the contact with the resin and the mask is removed after the resin filling so as to expose the conductor surface.

Establishment of electrical conduction between the surface and the back surface of the thus-produced electronic circuit substrate is facilitated by subjecting a through hole formed after the substrate is filled with a resin to electroless copper plating or the like.

In the electronic circuit substrate of the present invention, film devices are directly formed on the surface of a porous ceramic sintered body so that the film devices are firmly fitted among the particles of the sintered body and bonded therewith in a wedged state, thereby precluding the possibility of the separation of the film devices. Since the pores of the portion of the sintered body at which no film devices are formed are filled with a resin, the electronic circuit substrate is excellent in high-humidity resistance and high-temperature resistance.

Since the substrate is filled with a resin, the mechanical strength of the substrate as a whole is increased so much that the substrate is made difficult to crack and easy to machine, and a defect such as breakage and chipping is prevented. In addition, the permeation of a gas is prevented, so that the influence of the environment in which the electronic circuit substrate is used is effectively reduced.

Thus, according to the present invention, it is possible to provide a highly reliable electronic circuit substrate excellent in high-humidity resistance and high-temperature resistance.

According to the present invention, there can be provided a multi-layer electronic circuit substrate by bonding a plurality of electronic circuit substrates having the above-mentioned structure with each other into a laminate through an insulating layer (see FIG. 3).

A method of producing the above-mentioned multi-layer electronic circuit substrate comprises the steps of preparing a plurality of electronic circuit substrates each of which is composed of a porous ceramic sintered body with film devices provided thereon and a resin filled in the pores of the porous ceramic sintered body; and laminating a plurality of the electronic circuit substrates through an insulating layer.

As the insulating layer, a resin or a composite material of a resin and an inorganic material is used. As the resin, an epoxy resin, a phenol resin, a polyimide resin, etc. are usable. As the composite material of the resin and an inorganic resin, an epoxy resin and a glass fiber, a phenol resin and paper, an imide resin and silica powder, etc. are usable.

It is also possible to provide the aforesaid insulating layer on the surface of the multi-layer electronic circuit substrate and further a conductive layer thereon (see FIG. 7).

The conductor layer means an electronic circuit conductor. The conductor layer is formed by, for example, bonding conductive foil, sputtering, depositing or electroless plating.

It is also possible to singly use the electronic circuit substrate in place of a laminate and to form a conductive layer on the surface thereof through an insulating layer, thereby producing a multi-layer electronic circuit substrate (see FIG. 6).

A plurality of electronic circuit substrates are laminated through an insulating layer to produce the multi-layer electronic circuit substrate.

Accordingly, it is possible to provide a highly reliable multi-layer electronic circuit substrate excellent in high-humidity resistance, high-temperature resistance and machinability.

In the multi-layer electronic circuit substrate of the present invention, when an insulating layer is provided on the surface of the electronic circuit substrate having the above-described excellent properties and a conductive layer is further provided on the insulating layer, the multi-layer electronic circuit substrate has excellent properties as that set forth above.

In producing the aforesaid multi-layer electronic circuit substrate, there's a method comprising the steps of forming film devices directly on a porous ceramic sintered body; laminating a plurality of the porous ceramic bodies; and filling the pores of a plurality of the porous ceramic bodies with a resin.

In the multi-layer electronic circuit substrate thus obtained, film devices such as a conductive circuit are fit into the pores and recesses on the surface of the porous ceramic sintered body in close contact therewith in a wedged state. The pores other than those at which the film devices are formed are filled with a resin after the electronic circuit substrates are laminated.

Thus, according to the aforesaid method, it is possible to provide a highly reliable multi-layer electronic circuit substrate excellent in high-humidity resistance, high-temperature resistance and machinability.

The aforesaid multi-layer electronic circuit substrate may have a constitution comprising a plurality of electronic circuit substrates each laminated through a porous intermediate layer, the pores of which are filled with resin.

In producing the aforesaid multi-layer electronic circuit substrate, there's a method that a plurality of electronic circuit substrates each of which is fabricated by directly forming the film devices on the surface of the porous ceramic sintered body are laminated and adhered with a porous intermediate layer inserted between every adjacent electronic circuit substrates, and the pores of the sintered body are filled with a resin.

As the porous intermediate layer, an inorganic porous body such as glass or a metal porous body is used. For example, glass having a comparatively low melting point, a ceramic material, aluminum, gold, silver, copper and tungsten are usable. In order to make these materials porous, for example, a particulated powder is applied to the surface of the substrate, a plurality of such substrates are laminated and the laminate is sintered at a temperature lower than the melting point.

The porosity of the porous intermediate layer is preferably 5 to 50%. If it is in this range, it is possible to prevent the reduction in the thermal conductivity coefficient and to mitigate the stress caused by the difference in thermal expansion coefficient.

The porous intermediate layer can also be produced by laminating electronic circuit substrates, and green shaped bodies composed of ceramic powders which bodies are inserted between the electronic circuit substrates and firing the laminate at a high temperature. When the laminate is fired, the ceramic powders of the green shaped bodies are sintered, thereby producing the porous intermediate layer (see FIG. 12).

When a metal is used as the porous intermediate layer, if the film devices exist on the surface of the substrate which faces the intermediate layer, an electrical insulating layer is inserted therebetween.

The pores of the porous intermediate layer are also filled with a resin in the same manner as in a porous ceramic sintered body.

In the aforesaid multi-layer electronic circuit substrate, the porous intermediate layer is inserted between each electronic circuit substrate which is laminated with another. Since the porous intermediate layer is composed of an inorganic or metal material, the heat transfer efficiency is high. Therefore, the heat generated on each electronic circuit substrate is also efficiently released to the outside from the porous intermediate layer.

Thus it is possible to provide a highly reliable multi-layer electronic circuit substrate excellent in high-humidity resistance, high-temperature resistance, heat releasability and machinability.

According to the present invention, the aforesaid electronic circuit substrate may have a constitution further comprising radiators which are adhered to the surface of the porous ceramic sintered body. This electronic circuit substrate may be laminated to constitute a multi-layer electronic circuit substrate.

In producing the aforesaid multi-layer electronic circuit substrate, there's a method that a plurality of electronic circuit substrates each of which is fabricated by directly forming the film devices on the surface of the porous ceramic sintered body and adhering the radiators to the sintered body are laminated and adhered with a porous intermediate layer inserted between every adjacent electronic circuit substrates, and the pores of the sintered body are filled with a resin.

In the aforesaid electronic circuit substrate, the radiators are also fitted into the pores and recesses on the surface of the porous ceramic sintered body directly or through adhesive layers in close contact therewith in a wedged state. The pores other than those at which the film devices are formed are filled with a resin after the electronic circuit substrates are laminated.

As the radiators, a ceramic sintered body, diamond, a metal film, etc. are used, as will be described later. These radiators are adhered to the porous ceramic sintered body directly or through adhesive layers.

When the radiator is directly adhered to the surface of the porous ceramic sintered body, an opening is previously provided on a green ceramic shaped body by spot facing or punching, the radiator prepared is inserted into the opening, and the ceramic shaped body is then sintered, thereby thermally shrinking the opening for fitting the radiator thereinto. The radiator and the sintered body may also be bonded under pressurizing by hot pressing or the like. As examples of the radiator to which these methods are applicable, a high-radiation ceramic sintered body such as alumina, silicon carbide, aluminum nitride, and beryllium oxide will be cited. Alternatively, a method of forming film radiators made of a high-radiation ceramic such as diamond, silicon carbide and aluminum nitride on the surface of the porous ceramic sintered body by CVD or the like may be adopted. There is also a method of forming metal or inorganic film radiators by spraying, deposition or sputtering.

As an adhesive for bonding the porous ceramic sintered body and the radiators, metal and/or inorganic adhesives are usable.

When the porous ceramic sintered body and the radiators are bonded by such an adhesive, the adhesive powder is applied to the ceramic sintered body in advance, and after the radiators are placed on the ceramic sintered body in contact therewith, they are heated to a temperature at which the adhesive powder melts. In this case, the thermal expansion coefficient of the porous ceramic sintered body is preferably approximate to that of the radiators. If their expansion coefficients are not approximate to each other, the radiators are used in the form of small pieces so as to reduce the difference in thermal expansion coefficients. Alternatively, the thermal expansion coefficient of the adhesive is adjusted by varying the ratio of the metal powder and the inorganic material powder, or the metal and/or inorganic layers are formed in several different stages so as to have an intermediate thermal expansion coefficient between that of the porous ceramic sintered body and that of the radiators, thereby mitigating the thermal stress therebetween.

The adhesive layer composed of the metal and/or inorganic material is preferably as dense as possible so as to display excellent heat dissipation. For this purpose, the porosity of the adhesive layer is preferably not more than 30%.

A plurality of electronic circuit substrates provided with the radiators and the film devices as described above are laminated and bonded with each other by a porous intermediate layer provided therebetween so as to form a multi-layered body. Thereafter, the pores of the porous ceramic sintered body are filled with a resin to produce a multi-layer electronic circuit substrate (see FIG. 16).

In the aforesaid multi-layer electronic circuit substrate, since not only the film devices but also the radiators are bonded with the porous ceramic sintered body in close contact therewith, they are firmly fitted among the particles of the sintered body in a wedged state and bonded therewith. It is therefore possible to transfer the heat generated from the film devices on the substrate to the radiators with efficiency.

Since the multi-layer electronic circuit substrate is excellent in heat dissipation, as described above, it is possible to mount a large number of silicon integrated circuits which generate a large amount of heat and high-resistance elements on the aforesaid electronic circuit substrate, thereby meeting the demand for the reduction in size and high integration. The multi-layer electronic circuit of the present invention is useful as an electronic circuit substrate of an apparatus which generates a large amount of heat such as a power source module and an infrared generator.

Thus, it is possible to provide a highly reliable multi-layer electronic circuit substrate excellent in high-humidity resistance, high-temperature resistance, heat dissipation and machinability.

BRIEF DESCRIPTION OF THE DRAWINGS

FIG. 1 is a cross sectional view of the electronic circuit substrate.

FIG. 2 is an enlarged sectional view of the principal part.

FIG. 3 is a cross sectional view of the electronic circuit substrate.

FIG. 4 is a cross sectional view of one electronic circuit substrate of the multi-layer electronic substrate.

FIG. 5 is an enlarged sectional view of the principal part.

FIG. 8 is a cross sectional view of the multi-layer electronic circuit substrate.

FIG. 9 is a cross sectional view of one electronic circuit substrate of the multi-layer electronic circuit substrate.

FIG. 10 is an enlarged sectional view of the principal part.

FIG. 11 is a cross sectional view of a multi-layer electronic circuit substrate of Eighth Embodiment.

FIG. 12 is a cross sectional view of the multi-layer electronic circuit substrate.

FIG. 13 is a cross sectional view of one electronic circuit substrate of the multi-layer electronic circuit substrate.

FIG. 14 is an enlarged sectional view of the principal part.

FIG. 16 is a cross sectional view of the multi-layer electronic circuit substrate.

FIG. 17 is a cross sectional view of one electronic circuit substrate of the multi-layer electronic circuit substrate.

FIGS. 18 through 21 are enlarged sectional views of the principal parts to show the bonding condition of film devices and each of radiators to porous ceramic sintered body.

DESCRIPTION OF THE PREFERRED EMBODIMENTS

The following embodiments are given in the illustration of the invention and are not intended as limitations thereof.

First Embodiment 2 parts by weight of polyvinyl alcohol, 1 part by weight of polyethylene glycol, 0.5 part by weight of stearic acid and 100 parts by weight of water were added to 100 parts by weight of cordierite powder having an average particle diameter of 1.6 $\mu$m, and after they were mixed in a ball mill for 3 hours, the mixture was spray dried.

An appropriate amount of dried mixture was collected and molded under a pressure of 1.0 t/cm$^2$ by using a metal die, thereby obtaining a ceramic green shaped body 220 mm $\times$ 250 mm $\times$ 1.2 mm in size and 1.5 g cm$^3$ in density (60 vol %).

The green shaped body was fired in air at 1400° C. for 1 hour to obtain a porous cordierite sintered body.

The thus-obtained porous cordierite sintered body had a density of 1.8 g cm$^3$, a porosity of 30 vol % and an average porous diameter of 3.2 $\mu$m.

On the surface of the porous cordierite sintered body, a conductive circuit as a film device was formed by printing through a screen of 325 meshes by using a paste which contained 46% of silver-platinum particles having an average particle diameter of 11 $\mu$m and which had a viscosity of 90 Pa·s. Then, the sintered body was dried and fired in air at 850° C.

The bonding strength of the pattern of the conductive circuit at this time was 3 kg/mm$^2$. Thereafter, a thin film resistor was formed on the conductor by printing through a screen of 325 meshes by using a paste which contained 38% of ruthenium oxide particles having an average particle diameter of 16 $\mu$m and which had a viscosity of 160 Pa·s. The resistance at this time was $\Omega/\square$.

The porous cordierite sintered body was then impregnated with a two-part liquid epoxy resin from the opposite surface to the surface on which the film devices were formed and hardened to obtain an electronic circuit substrate. The sintered body was impregnated with a solventless liquid epoxy resin under vacuum.

The bonding strength of the pattern at this time was 3.8 kg/mm$^2$. When a high-temperature and high-humidity life test was conducted on the substrate at 85° C. and 85% RH (relative humidity) for 1,000 hours, the rate of change in resistance was as low as 0.32% and it exhibited an excellent stability.

Figure 1:
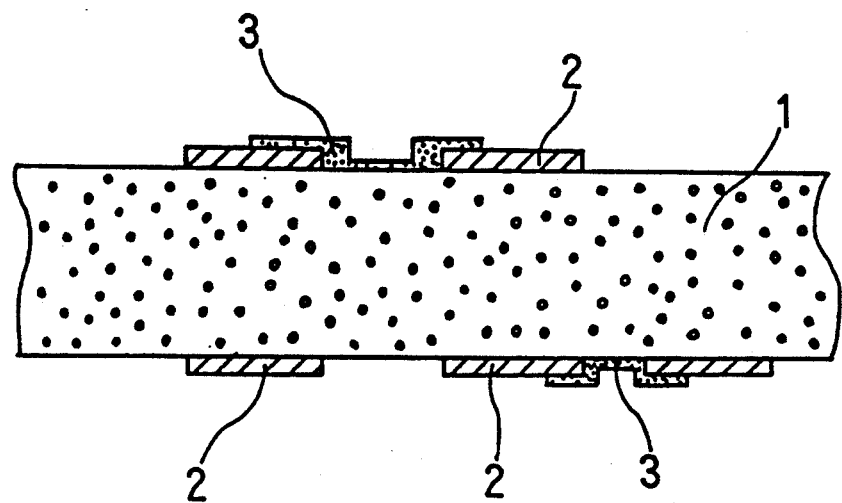
FIGS. 1 and 2 show an electronic circuit substrate of First Embodiment.

The electronic circuit substrate obtained in the above-described way was produced by firmly bonding the film conductive circuits 2 and the film resistors 3 to the surface and the back surface of the porous cordierite sintered body 1 in close contact therewith, as shown in FIG. 1.

Figure 2:
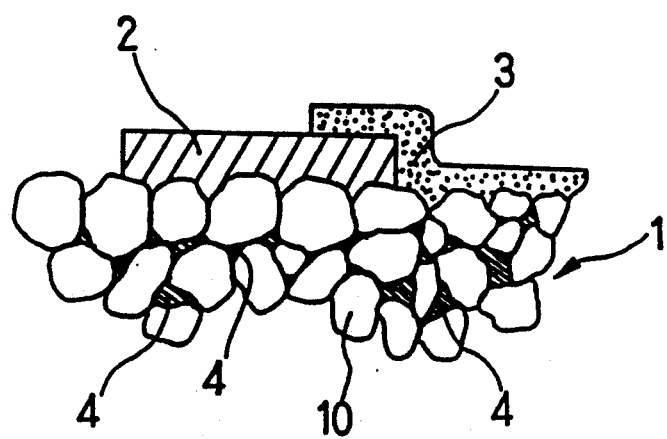

The under surfaces of the film conductive circuit 2 and the film resistor 3 are fitted into the uneven surface portion among a multiplicity of ceramic particles 10 which constitute the porous cordierite substrate in close contact therewith in a wedged state, as shown in FIG. 2. In the interior of the substrate 1, the pores formed among the ceramic particles 10 are filled with a resin 4.

For comparison, a porous cordierite sintered body was produced in the same way and was immediately impregnated with a similar two-part liquid epoxy resin. A copper foil was simultaneously laminated, thereby obtaining a substrate. Circuits were formed by etching. The peeling strength at this time was as low as 1.8 kg/cm.

A resin-carbon resistor was formed on the surface of the circuit by printing. The resistance was 870 $\Omega/\square$. When a high-temperature and high-humidity life test was conducted on the substrate at 85° C. and 85% RH for 1,000 hours in the same way, the rate of change in resistance was as high as 5.3%, and it could be considered to be unstable.

Second Embodiment 50 parts by weight of alumina powder having an average particle diameter of 0.7 $\mu$m, 12 parts by weight of polyacrylic acid ester, 1 part by weight of polyester dispersant, 2 parts by weight of dibutyl phthalate and 50 parts by weight of ethyl acetate were added to 50 parts by weight of alumina powder having an average particle diameter of 2.4 $\mu$m, and after they were mixed in a ball mill for 3 hours, the mixture was sheet formed.

The green shaped body was fired in air at 1550° C. for 1 hour to obtain a porous alumina sintered body.

The thus-obtained porous alumina sintered body had a density of 2.9 g cm$^3$, a porosity of 25 vol % and an average porous diameter of 1.2 $\mu$m.

On the surface of the porous alumina sintered body, a film resistor was formed by printing through a screen of 250 meshes by using a paste which contained 41% of lanthanum boride-tin oxide particles having an average particle diameter of 18 $\mu$m and which had a viscosity of 110 Pa·s. in the same way as in the first embodiment. After the sintered body was dried, it was fired in nitrogen at 900° C.

Thereafter, a film conductive circuit was formed on the film resistor by printing through a screen of 250 meshes using a paste which contained 50% of copper particles having an average particle diameter of 8 $\mu$m and which had a viscosity of 120 Pa·s. The sintered body was then dried and fired in nitrogen at 600° C. The bonding strength of the pattern at this time was 2.5 kg/mm$^2$. The resistance at this time was 80 K$\Omega/\square$.

The porous alumina cordierite sintered body was then impregnated with a two-part liquid epoxy resin and hardened to obtain an electronic circuit substrate.

The bonding strength of the pattern at this time was 3.4 kg/mm$^2$. When a high-temperature and high-humidity life test was conducted on the substrate at 85° C. and 85% RH for 1,000 hours, the rate of change in resistance was as low as 1.1% and it exhibited an excellent stability.

The electronic circuit substrate was drilled with a diamond drill 0.4 mm in diameter to form a through hole, and conduction between the circuits on the surface and the back surface was established by electroless copper plating. The electronic circuit substrate allowed not less than 120,000 holes to be formed in an area of 350 mm $\times$ 250 mm.

Third Embodiment

An embodiment of a multi-layer electronic circuit substrate of the present invention will be explained with reference to FIGS. 3 to 5.

Figure 3:
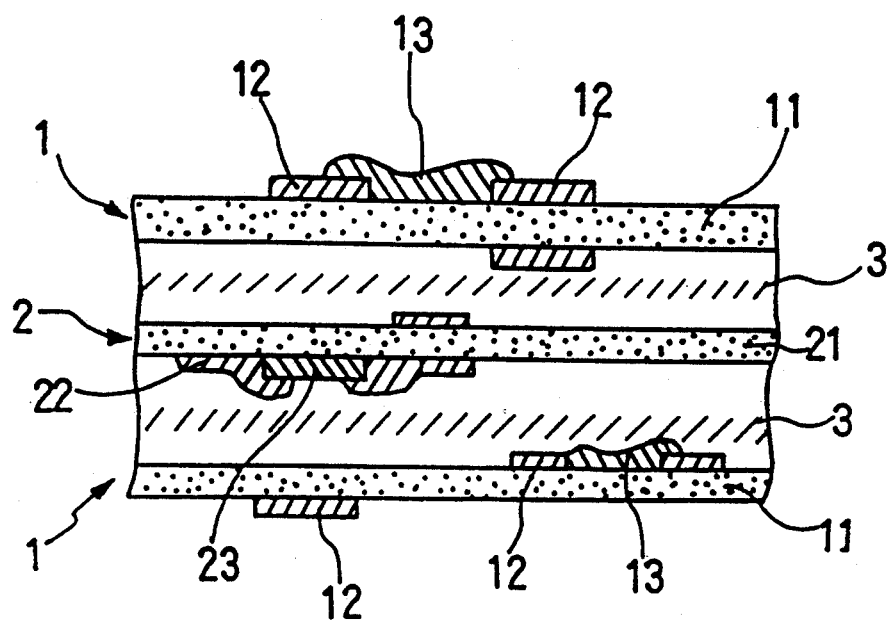
FIGS. 3 through 5 show a multi-layer electronic circuit substrate of Third Embodiment.

The multi-layer electronic circuit substrate is produced by laminating electronic circuit substrates 1 on and beneath a center electronic circuit substrate 2 through insulating layers 3, and bonding these substrates and insulating layers into one substrate, as shown in FIG. 3. The electronic circuit substrate 1 is composed of film conductive circuits 12 and a film resistor 13 provided on the surface of a porous ceramic sintered body 11 as a substrate and the film conductive circuit 12 provided on the back surface thereof in close contact therewith, as shown in FIG. 4.

Figure 5:
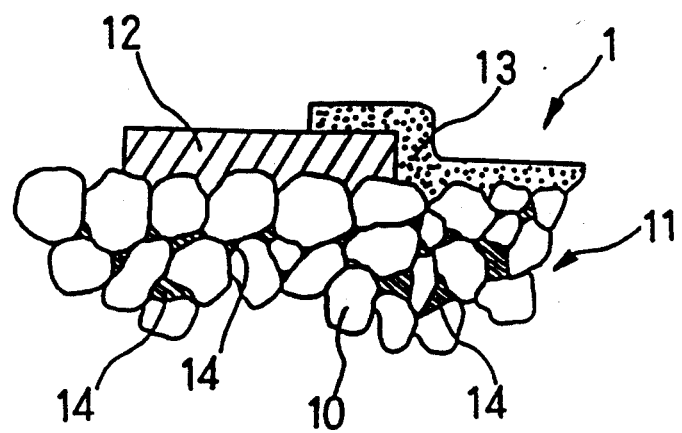

The under surfaces of the film conductive circuit 12 and the film resistor 13 are fitted into the uneven surface portion among a multiplicity of ceramic particles 10 which constitute the porous ceramic sintered body 11 in close contact therewith in a wedged state, as shown in FIG. 5. In the interior of the porous ceramic sintered body 11, the pores formed among the ceramic particles 10 are filled with a resin 14.

The electronic circuit substrate 2 is the same as the electronic circuit substrate 1.

As described above, the multi-layer electronic circuit substrate of this embodiment is composed of the electronic circuit substrates 1 and the electronic circuit substrate 2 provided therebetween. Each of the electronic circuit substrate has film devices both on the surface and the back surface thereof. That is, the multi-layer electronic circuit substrate of this embodiment is a 6-layer circuit.

Fourth Embodiment

Figure 6:
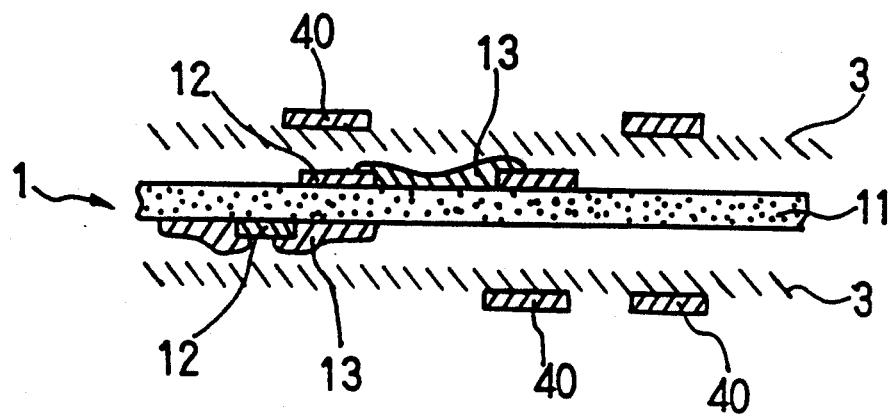
FIG. 6 is a cross sectional view of a multi-layer electronic circuit substrate of Fourth Embodiment.

This embodiment is a multi-layer electronic circuit substrate produced by providing an insulating layer 3 on the surface of the electronic circuit substrate 1 and further a conductive layer 40 on the insulating layer 3, as shown in FIG. 6. The electronic circuits substrate 1 is the same as in the third embodiment.

Fifth Embodiment

Figure 7:
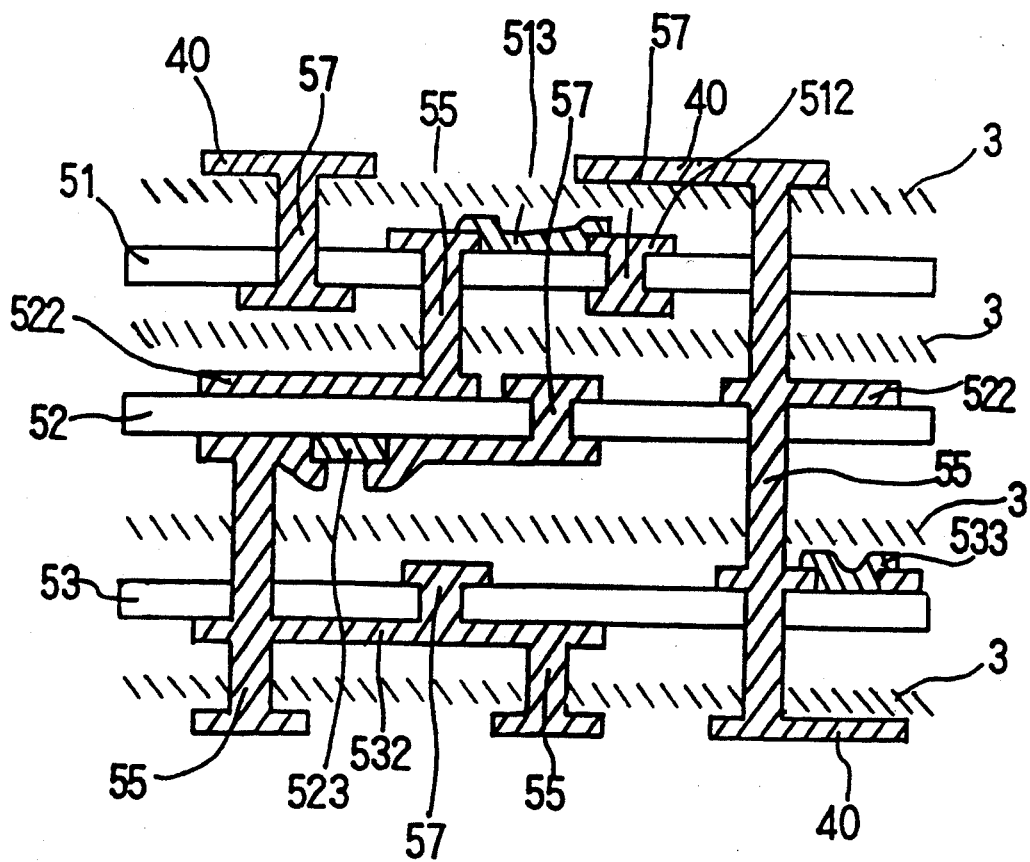
FIG. 7 is a cross sectional view of a multi-layer electronic circuit substrate of Fifth Embodiment.

This embodiment is a multi-layer electronic circuit substrate having an 8-layer circuit, as shown in FIG. 7. An insulating layer is provided on the outermost layers and a conductive layer is provided thereon.

The multi-layer electronic circuit of this embodiment is produced by laminating the electronic circuit substrates 51, 52 and 53 through insulating layers, bonding them with each other and providing an insulating layer 3 on both the upper and the lower outermost surfaces and a conductive layer 40 thereon.

The electronic circuit substrates 51, 52 and 53 are provided with film conductive circuits 512, 522 and 532, respectively, and film resistors 513, 523 and 533, respectively, on the surfaces thereof. The electronic circuit substrates 51, 52 and 53 are also provided with through holes 55 conductive between substrates and through holes 57 conductive inside a substrate between the film conductive circuits and the film resistors.

These film conductive circuits 512, 522 and 532 and the film resistors 513, 523 and 533 are bonded with the porous ceramic sintered bodies as substrates in close contact therewith and the porous ceramic sintered bodies are filled with the resin in the same way as in the electronic circuit substrate 1 in the third embodiment.

In the multi-layer circuit substrates of the third through fifth embodiments, each electronic circuit substrate which constitutes the multi-layer circuit substrate has the above-described structure. Therefore, the multi-layer electronic circuit substrate is excellent in high-humidity resistance, high-temperature resistance and machinability and has a high reliability.

Sixth Embodiment

A multi-layer electronic circuit substrate having an 8-layer circuit (see FIG. 7) of the fifth embodiment was produced and various tests were carried thereon.

The multi-layer circuit substrate was produced by first producing an electronic circuit substrates A and electronic circuit substrate B and laminating the electronic circuit substrates A on and beneath the electronic circuit substrate B.

In order to produce the electronic circuit substrates A, 2 parts by weight of polyvinyl alcohol, 1 part by weight of polyethylene glycol, 0.5 part by weight of stearic acid and 100 parts by weight of water were added to 100 parts by weight of cordierite powder having an average particle diameter of 1.6 $\mu$m, and after they were mixed in a ball mill for 3 hours, the mixture was spray dried.

An appropriate amount of dried mixture was collected and molded under a pressure of 1.0 t/cm$^2$ by using a metal die, thereby obtaining a ceramic green shaped body 220 mm $\times$ 250 mm $\times$ 1.2 mm in size and 1.5 g/cm$^3$ in density (60 vol %).

The green shaped body was fired in air at 1400° C. for 1 hour to obtain a porous cordierite sintered body.

The thus-obtained porous cordierite sintered body had a thickness of 0.2 mm, a density of 1.8 g cm$^3$, a porosity of 30 vol % and an average porous diameter of 3.2 $\mu$m.

On the surface of the porous cordierite sintered body, a conductive circuit as a film device was formed by printing through a screen of 325 meshes by using a paste which contained 46% of silver-platinum particles having an average particle diameter of 11 $\mu$m and which had a viscosity of 90 Pa·s. The sintered body was then dried and fired in air at 850° C.

The bonding strength of the pattern of the conductive circuit at this time was 3 kg/mm$^2$. Thereafter, a thin film resistor was formed on the conductor by printing through a screen of 325 meshes by using a paste which contained 38% of ruthenium oxide particles having an average particle diameter of 16 $\mu$m and which had a viscosity of 160 Pa·s. The sintered body was then dried and fired in air at 850° C. The resistance at this time was 23 $\Omega/\square$.

The porous cordierite sintered body was then impregnated with a two-part liquid epoxy resin and hardened to obtain an electronic circuit substrate. The sintered body was impregnated with a solventless liquid epoxy resin in vacuo.

The bonding strength of the pattern at this time was 3.8 kg/mm$^2$. When a high-temperature and high-humidity life test was conducted on the substrate at 85° C. and 85% RH (relative humidity) for 1,000 hours, the rate of change in resistance was as low as 0.32% and it exhibited an excellent stability.

The substrate was drilled with a diamond drill 0.55 mm in diameter to form a through hole, and conduction between the circuits on the surface and the back surface was established by electroless copper plating to a thickness of 10 $\mu$m.

In this way, the electronic circuit substrates A were produced.

In order to produce the electronic circuit substrate B, 50 parts by weight of alumina powder having an average particle diameter of 0.7 $\mu$m, 12 parts by weight of polyacrylic acid ester, 1 part by weight of polyester dispersant, 2 parts by weight of dibutyl phthalate and 50 parts by weight of ethyl acetate were added to 50 parts by weight of alumina powder having an average particle diameter of 2.4 $\mu$m, and after they were mixed in a ball mill for 3 hours, the mixture was sheet formed.

The green shaped body was fired in air at 1550° C. for 1 hour to obtain a porous alumina sintered body.

The thus-obtained sintered body had a thickness of 0.3 mm, a density of 2.9 g cm$^3$, a porosity of 25 vol % and an average porous diameter of 1.2 $\mu$m.

On the surface of the sintered body, a film resistor was formed by printing through a screen of 250 meshes by using a paste which contained 41% of lanthanum boride-tin oxide particles having an average particle diameter of 18 $\mu$m and which had a viscosity of 110 Pa·s. The sintered body was dried and then fired in nitrogen at 900° C.

Thereafter, a conductive circuit was formed on the film resistor by printing through a screen of 250 meshes by using a paste which contained 50% of copper particles having an average particle diameter of 8 $\mu$m and which had a viscosity of 120 Pa·s. The sintered body was dried and then fired in nitrogen at 600° C. The bonding strength of the pattern at this time was 2.5 kg/mm$^2$. The resistance at this time was 80 k$\Omega/\square$.

The porous alumina sintered body was then impregnated with a two-part liquid epoxy resin and hardened to obtain an electronic circuit substrate.

The bonding strength of the pattern at this time was 3.4 kg/mm$^2$. When a high-temperature and high-humidity life test was conducted on the substrate at 85° C. and 85% RH (relative humidity) for 1,000 hours, the rate of change in resistance was as low as 1.1% and it exhibited an excellent stability.

The substrate was drilled with a diamond drill 0.25 mm in diameter to form a through hole, and conduction between the circuits on the surface and the back surface was established by electroless copper plating to a thickness of 15 $\mu$m.

In this way, the electronic circuit substrate B was produced.

The electronic circuit substrates A (first and third layers) composed of the porous cordierite sintered body and the electronic circuit substrate B (second layer) composed of the porous alumina sintered body were laminated, as shown in FIG. 7. The laminate was pressed with a BT resin prepreg of 0.05 mm thick interposed in every adjacent substrates as an insulating layer.

The laminate was drilled with a diamond drill 0.40 mm in diameter to form a through hole, and conduction among the three substrates was established by electroless copper plating to a thickness of 10 $\mu$m.

An epoxy resin was applied to both the surface and the back surface of the laminate to a thickness of 100 $\mu$m as an insulating layer and a copper foil of 18 $\mu$m thick was placed on the applied epoxy resin and pressed in vacuo so as to form a conductive layer on both surfaces of the laminate.

The laminate was drilled with a diamond drill 0.40 mm in diameter from both surfaces to the intermediate layer to form a through hole, which was subjected to electroless copper plating to a thickness of 10 $\mu$m, thereby establishing electrical conduction. The upper and lower conductive layers were etched to form circuits.

The thus-obtained multi-layer electronic circuit substrate had an 8-layer circuit and the total thickness was as thin as 1.25 mm. The thickness is very thin. The multi-layer circuit substrate had 48 built-in film resistors and 22 built-in film capacitor devices per cm$^2$. That is, the mounting density of the multi-layer electronic circuit substrate was very high.

The heat resistance test was carried out on the multi-layer electronic circuit substrate by repeating a cycle of oil dipping at 20° C. for 30 seconds and at 260° C. for 30 seconds. Even after 500 cycles of oil dipping, a defect such as breaking of wire and separation between substrate layers was not produced.

Figure 4:
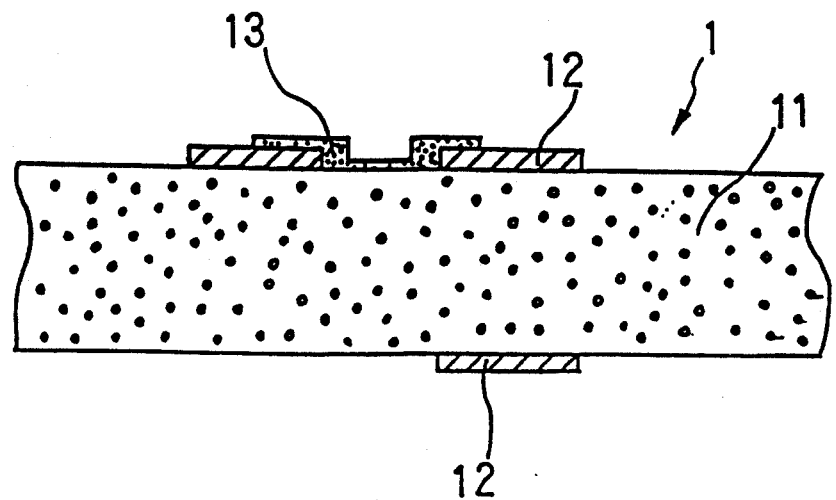

Each of the electronic circuit substrates A and B was produced by firmly bonding the film conductive circuits 12 and the film resistors 13 to the surface and the back surface of the porous ceramic sintered body 11 in close contact therewith, as shown in FIGS. 4 and 5 (the details are described in the third embodiment).

For comparison, a porous cordierite sintered body was produced in the same way and was immediately impregnated with a similar two-part liquid epoxy resin. A copper foil was simultaneously laminated, thereby obtaining a substrate. Then, circuits were formed by etching. The peeling strength at this time was as low as 1.8 kg/cm.

Each of the electronic circuit substrates A and B allowed not less than 120,000 holes to be formed in an area of 350 mm×250 mm. In this way, the electronic circuit substrate of the present invention had a high strength and an excellent machinability.

Seventh Embodiment

An embodiment of a multi-layer electronic circuit substrate of the present invention will now be explained with reference to FIGS. 8 through 10.

Figure 8:
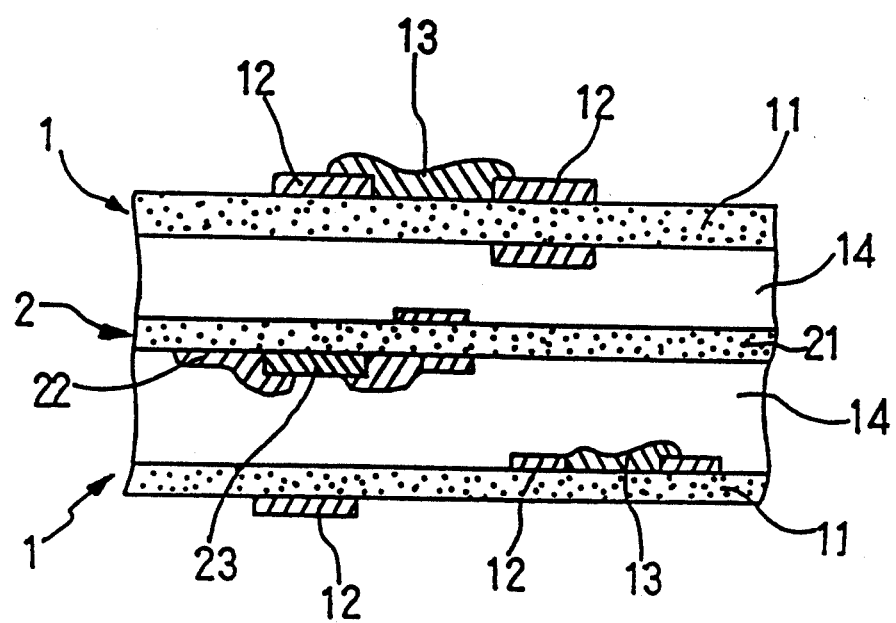
FIG. 8 through 11 show a multi-layer electronic circuit substrate of Seventh Embodiment.
Figure 9:
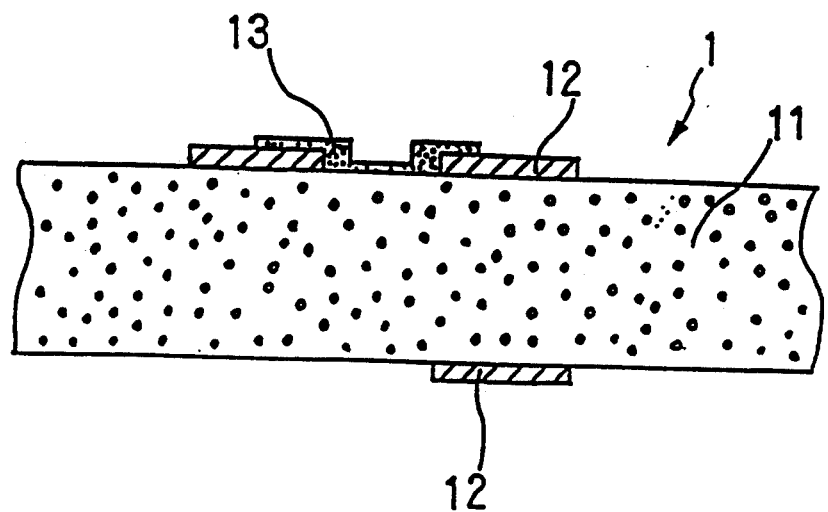

The multi-layer electronic circuit substrate is produced by laminating electronic circuit substrates 1 on and beneath a center electronic circuit substrate 2, and bonding these substrates into one substrate, as shown in FIG. 8. The electronic circuit substrate 1 is composed of film conductive circuits 12 and a film resistor provided on the surface of a porous ceramic sintered body 11 as substrate and the film conductive circuit 12 provided on the back surface thereof in close contact therewith, as shown in FIG. 9.

Figure 10:
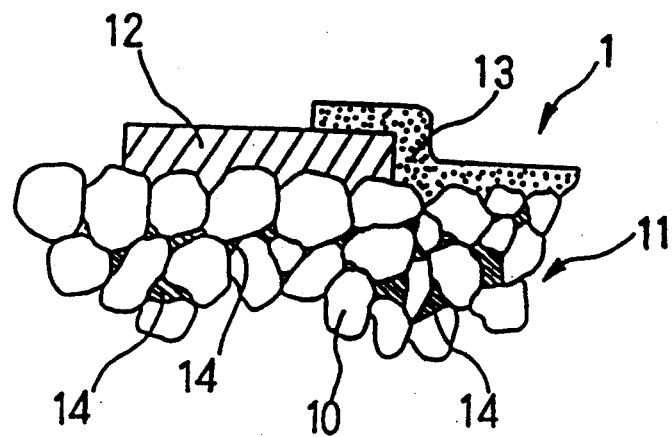

The under surfaces of the film conductive circuit 12 and the film resistor 13 are fitted into the uneven surface portion among a multiplicity of ceramic particles 10 which constitute the porous ceramic sintered body 11 in close contact therewith in a wedged state, as shown in FIG. 10. In the interior of the porous ceramic sintered body 11, the pores formed among the ceramic particles 10 are filled with a resin 14 with which the sintered body 11 has been impregnated after the lamination.

The electronic circuit substrate 2 is the same as the electronic circuit substrate 1.

As described above, the multi-layer electronic circuit substrate of this embodiment is composed of the electronic circuit substrates 1 and the electronic circuit substrate 2 provided therebetween. Each of the electronic circuit substrate has film devices both on the surface and the back surface thereof. That is, the multi-layer electronic circuit substrate of this embodiment is a 6-layer circuit.

Since the multi-layer circuit substrate is impregnated with a resin by dipping the whole laminate into a molten resin after the lamination, the resin 14 is filled between every adjacent substrate and the surfaces thereof are coated with the resin.

Eighth Embodiment

Figure 11:
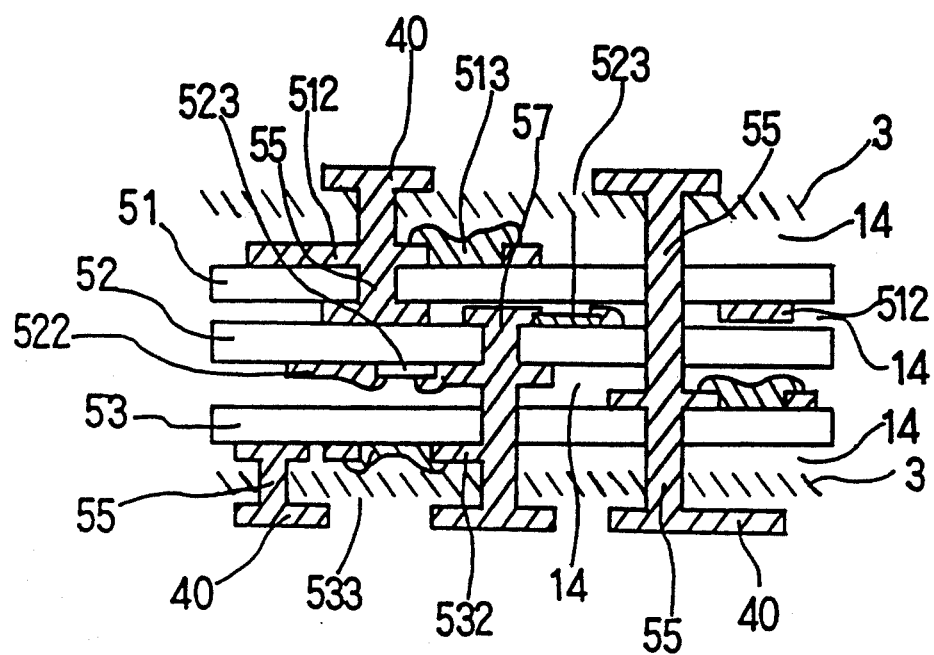

This embodiment is a multi-layer electronic circuit substrate having an 8-layer circuit, as shown in FIG. 11. An insulating layer is provided on the outermost layers and a conductive layer is provided thereon.

The multi-layer electronic circuit of this embodiment is produced by laminating the electronic circuit substrates 51, 52 and 53, bonding them with each other and providing an insulating layer 3 on both the upper and the lower outermost surfaces and a conductive layer 40 thereon.

The electronic circuit substrates 51, 52 and 53 are provided with film conductive circuits 512, 522 and 532, respectively, and film resistors 513, 523 and 533, respectively, on the surfaces thereof. The electronic circuit substrates 51, 52 and 53 are also provided with through holes 55 conductive between substrates and through holes 57 conductive inside a substrate between the film conductive circuits and the film resistors. The resin layer 14 is formed between every adjacent electronic circuit substrate by impregnating the laminate with the resin, which secures the electrical insulating property therebetween.

These film conductive circuits 512, 522 and 532 and the film resistors 513, 523 and 533 are bonded with the porous ceramic sintered bodies as substrates in close contact therewith and the pores of the porous ceramic sintered body are filled with the resin in the same way as in the electronic circuit substrate 1 in the seventh embodiment.

In the multi-layer circuit substrates of the seventh and eighth embodiment, each electronic circuit substrate which constitutes the multi-layer circuit substrate has the above-described structure, and the pores of the porous ceramic sintered body are filled with a resin. Therefore, the multilayer electronic circuit substrate is excellent in high-humidity resistance, high-temperature resistance and machinability and has a high reliability.

Ninth Embodiment

A multi-layer electronic circuit substrate having an 8-layer circuit (see FIG. 11) of the eighth embodiment was produced and various tests were carried thereon.

The multi-layer circuit substrate was produced by first producing an electronic circuit substrates A and electronic circuit substrate B and laminating the electronic circuit substrates A on and beneath the electronic circuit substrate B.

In order to produce the electronic circuit substrates A, 2 parts by weight of polyvinyl alcohol, 1 part by weight of polyethylene glycol, 0.5 part by weight of stearic acid and 100 parts by weight of water were added to 100 parts by weight of cordierite powder having an average particle diameter of 1.8 $\mu$m, and after they were mixed in a ball mill for 3 hours, the mixture was spray dried.

An appropriate amount of dried mixture was collected and molded under a pressure of 1.0 t/cm$^2$ by using a metal die, thereby obtaining a ceramic green shaped body 220 mm×250 mm×1.2 mm in size and 1.5 g/cm$^3$ in density (60 vol %).

The green shaped body was fired in air at 1400° C. for 1 hour to obtain a porous cordierite sintered body.

The thus-obtained porous cordierite sintered body had a thickness of 0.25 mm, a density of 1.8 g/cm$^3$, a porosity of 30 vol % and an average porous diameter of 3.2 μm.

On the surface of the porous cordierite sintered body, a conductive circuit as a film device was formed by printing through a screen of 325 meshes by using a paste which contained 46% of silver-platinum particles having an average particle diameter of 11 μm and which had a viscosity of 90 Pa·s. The sintered body was dried and fired in air at 850° C.

The bonding strength of the pattern of the conductive circuit at this time was 3 kg/mm$^2$. Thereafter, a thin film resistor was formed on the conductor by printing through a screen of 325 meshes by using a paste which contained 38% of ruthenium oxide particles having an average particle diameter of 16 μm and which had a viscosity of 160 Pa·s. The sintered body was then dried and fired in air at 850° C. The resistance at this time was 23 Ω/□.

When a high-temperature and high-humidity life test was conducted on the substrate at 85° C. and 85% RH (relative humidity) for 1,000 hours, the rate of change in resistance was as low as 0.15%, and it exhibited an excellent stability.

In this way, the electronic circuit substrate A was produced.

In order to produce the electronic circuit substrate B, 50 parts by weight of alumina powder having an average particle diameter of 0.7 μm, 12 parts by weight of polyacrylic acid ester, 1 part by weight of polyester dispersant, 2 parts by weight of dibutyl phthalate and 50 parts by weight of ethyl acetate were added to 50 parts by weight of alumina powder having an average particle diameter of 2.4 μm, and after they were mixed in a ball mill for 3 hours, the mixture was sheet formed.

The green shaped body was fired in air at 1550° C. for 1 hour to obtain a porous alumina sintered body.

The thus-obtained sintered body had a thickness of 0.25 mm, a density of 2.9 g/cm$^3$, a porosity of 25 vol % and an average porous diameter of 1.2 μm.

On the surface of the sintered body, a film resistor was formed by printing through a screen of 250 meshes by using a paste which contained 41% of lanthanum boride-tin tin oxide particles having an average particle diameter of 18 μm and which had a viscosity of 110 Pa·s. Then, sintered body was dried and then fired in nitrogen at 900° C.

Thereafter, a conductive circuit was formed on the film resistor by printing through a screen of 250 meshes by using a paste which contained 50% of copper particles having an average particle diameter of 8 μm and which had a viscosity of 120 Pa·s. Then, the sintered body was dried and fired in nitrogen at 600° C. The bonding strength of the pattern at this time was 2.5 kg/mm$^2$. The resistance at this time was 80 KΩ/□.

When a high-temperature and high-humidity life test was conducted on the substrate at 85° C. and 85% RH (relative humidity) for 1,000 hours, the rate of change in resistance was as low as 0.8%, and it exhibited an excellent stability.

In this way, the electronic circuit substrate B was produced.

The electronic circuit substrates A (first and third layers) composed of the porous cordierite sintered body and the electronic circuit substrate B (second layer) composed of the porous alumina sintered body were laminated into three layers, as shown in FIG. 11.

The laminate was then impregnated with a two-part liquid epoxy resin and hardened to obtain a multi-layer electronic circuit substrate. The laminate was placed in vacuo for deaeration and thereafter a resin in an unhardened and highly fluid state was charged in the container accommodating the laminate so as to impregnate the laminate with the resin. Impregnation was carried out under a pressure of 10 atm. Thereafter, the laminate was heated at 150° C. for 8 hours to harden the resin.

The laminate was drilled with a diamond drill 0.40 mm in diameter to form a through hole, which was subjected to electroless copper plating to a thickness of 10 μm, thereby establishing electrical conduction among the three substrates.

On both surfaces of the resin-filled laminate, a BT resin prepreg of 0.05 mm thick as an insulating layer and a copper foil of 18 μm thick were then placed to form a conductive layer on both surfaces of the laminate by vacuum pressing.

The laminate was drilled with a diamond drill 0.40 mm in diameter from both surfaces to the intermediate layers, and conduction was established by electroless copper plating to a thickness of 15 μm in the same way. The upper and lower conductive layers were etched to form circuits.

The thus-obtained multi-layer electronic circuit substrate had an 8-layer circuit and the total thickness was as thin as 1.05 mm. The thickness is very thin. The multi-layer circuit substrate had 46 built-in film resistors and 24 built-in film capacitor devices per cm$^2$. That is, the mounting density of the multi-layer electronic circuit substrate was very high.

The heat resistance test was carried out on the multi-layer electronic circuit substrate by repeating a cycle of oil dipping at 20° C. for 30 seconds and at 260° C. for 30 seconds. Even after 500 cycles of oil dipping, a defect such as breaking of wire and separation between substrate layers was not produced.

When a high-temperature and high-humidity life test was conducted on the multi-layer electronic circuit substrate at 85° C. and 85% RH for 1,000 hours, the rate of change in resistance was as low as 0.38% in the ruthenium oxide substrate and 1.53% in the lanthanum boride-tin oxide substrate, and it exhibited an excellent stability.

Each of the electronic circuit substrates A and B was produced by firmly bonding the film conductive circuits 12 and the film resistors 13 to the surface and the back surface of the porous ceramic sintered body 11 in close contact therewith, as shown in FIGS. 2 and 3 (the details are described in the seventh embodiment).

For comparison, a porous cordierite sintered body was produced in the same way and was immediately impregnated with a similar two-part liquid resin. A copper foil was simultaneously laminated, thereby obtaining a substrate. Then, circuits were formed by etching. The peeling strength at this time was as low as 1.8 kg/cm.

Each of the electronic circuit substrates A and B allowed not less than 120,000 holes to be formed in an area of 350 mm×250 mm in electronic circuit substrates A and B. In this way, the electronic circuit substrate of the present invention had a high strength and an excellent machinability.

Tenth Embodiment

An embodiment of a multi-layer electronic circuit substrate of the present invention will now be explained with reference to FIGS. 12 through 14.

The multi-layer electronic circuit substrate is produced by laminating electronic circuit substrates 1 on and beneath a center electronic circuit substrate 2, and bonding these substrates into one substrate with porous intermediate layers 6 therebetween. The electronic circuit substrate 1 is composed of film conductive circuits 12 and a film resistor 13 provided on the surface of a porous ceramic sintered body 11 as a substrate and the film conductive circuit 12 provided on the back surface thereof in close contact therewith, as shown in FIG. 13.

Figure 14:
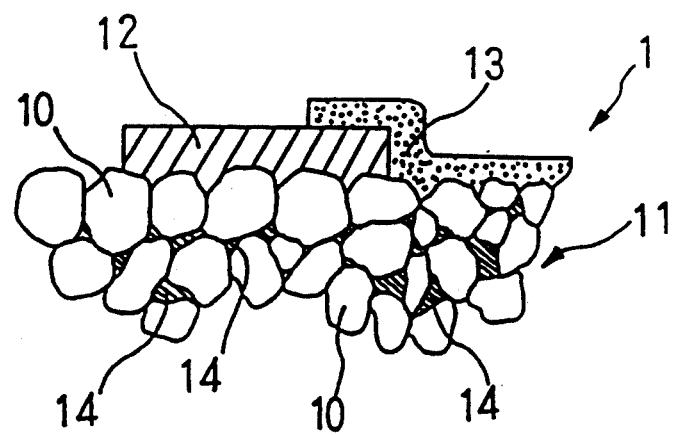

The under surfaces of the film conductive circuit 12 and the film resistor 13 are fitted into the uneven surface portion among a multiplicity of ceramic particles 10 which constitute the porous ceramic sintered body 11 in close contact therewith in a wedged state, as shown in FIG. 14. In the interior of the porous ceramic sintered body 11, the pores formed among the ceramic particles 10 are filled with a resin 14 with which the sintered body 11 has been impregnated after the lamination.

The electronic circuit substrate 2 is the same as the electronic circuit substrate 1. The pores of the porous intermediate layer are also filled with the resin.

As described above, the multi-layer electronic circuit substrate of this embodiment is produced by disposing the electronic circuit substrate 2 between the electronic circuit substrates 1 and bonded with each other by the porous intermediate layers 6. Each of the electronic circuit substrate has film devices both on the surface and the back surface thereof. That is, the multi-layer electronic circuit substrate of this embodiment is a 6-layer circuit. As the porous intermediate layer, glass is used.

Since the multi-layer electronic circuit substrate is impregnated with a resin by dipping the whole laminate into a molten resin after the lamination, the surface thereof is coated with the resin.

Eleventh Embodiment

Figure 15:
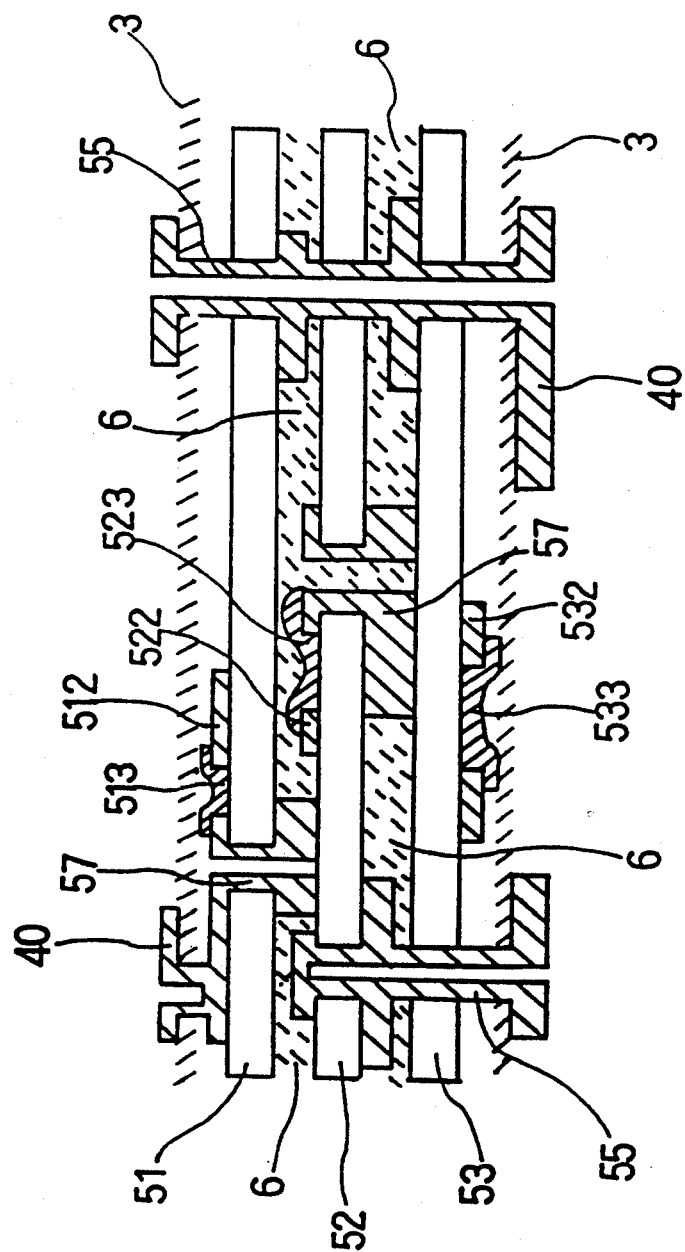
FIG. 15 is a cross sectional view of a multi-layer electronic circuit substrate of Eleventh Embodiment.

This embodiment is a multi-layer electronic circuit substrate having an 8-layer circuit, as shown in FIG. 15. An insulating layer is provided on the outermost layers and a conductive layer is provided thereon.

The multi-layer electronic circuit of this embodiment is produced by laminating the electronic circuit substrates 51, 52 and 53, bonding them with each other and providing an insulating layer 3 on both the upper and the lower outermost surfaces and a conductive layer 40 thereon.

The electronic circuit substrates 51, 52 and 53 are provided with film conductive circuits 512, 522 and 532, respectively, and film resistors 513, 523 and 533, respectively, on the surfaces thereof. The electronic circuit substrates 51, 52 and 53 are also provided with through holes 55 conductive between substrates and 57 conductive inside a substrate between the film conductive circuits and the film resistors.

The porous intermediate layer 6 is interposed between every adjacent layers of the electronic circuit substrates 51, 52 and 53 so as to bond the substrates with each other. The porous intermediate layer 6 is composed of a ceramic material.

These film conductive circuits 512, 522 and 532 and the film resistors 513, 523 and 533 are bonded with the porous ceramic sintered bodies as substrates in close contact therewith, and the porous ceramic sintered body and the porous intermediate layers are filled with the resin in the same way as in the electronic circuit substrate 1 in the tenth embodiment.

In the multi-layer circuit substrates of the tenth and eleventh embodiments, each electronic circuit substrate which constitutes the multi-layer circuit substrate has the above-described structure, and a porous intermediate layer having a high heat transfer efficiency is interposed between every adjacent electronic circuit substrates. The pores of the porous ceramic sintered body are filled with a resin. Therefore, the multi-layer electronic circuit substrate is excellent in high-humidity resistance, high-temperature resistance, heat dissipation and machinability and has a high reliability.

Twelfth Embodiment

A multi-layer electronic circuit substrate having 8-layer circuit (see FIG. 15) of the eleventh embodiment was produced and various tests were carried on.

The multi-layer circuit substrate was produced by first producing an electronic circuit substrates A and electronic circuit substrate B and laminating the electronic circuit substrates A on and beneath the electronic circuit substrate B.

In order to produce the electronic circuit substrate A, 2 parts by weight of polyvinyl alcohol, 1 part by weight of polyethylene glycol, 0.5 part by weight of stearic acid and 100 parts by weight of water were added to 100 parts by weight of cordierite powder having an average particle diameter of 1.8 $\mu$m, and after they were mixed in a ball mill for 3 hours, the mixture was spray dried.

An appropriate amount of dried mixture was collected and molded under a pressure of 1.0 t/cm$^2$ by using a metal die, thereby obtaining a ceramic green shaped body 220 mm $\times$ 250 mm $\times$ 1.2 mm in size and 1.5 g cm$^3$ in density (60 vol %).

After the green shaped body was punched, it was calcinated at 300° C. to remove the organic binder. A gold wiring pattern was sputtered on the surface of the shaped body to a thickness of 0.5 $\mu$m.

In this way, the electronic circuit substrate A was produced.

In order to produce the electronic circuit substrate B, 50 parts by weight of alumina powder having an average particle diameter of 0.32 $\mu$m, 12 parts by weight of polyacrylic acid ester, 1 part by weight of polyester dispersant, 2 parts by weight of dibutyl phthalate and 50 parts by weight of ethyl acetate were added to 50 parts by weight of alumina powder having an average particle diameter of 0.68 $\mu$m, and after they were mixed in a ball mill for 3 hours, the mixture was sheet formed.

After the green shaped body was punched, it was calcinated at 300° C. to remove the organic binder. A gold wiring pattern was sputtered on the surface of the shaped body to a thickness of 0.5 $\mu$m.

In this way, the electronic circuit substrate B was produced.

The electronic circuit substrates A (first and third layers) consisting of the porous cordierite sintered body and the electronic circuit substrate B (second layer) consisting of the porous alumina sintered body were laminated into three layers, as shown in FIG. 15. The laminate was fired in air at 1350° C. under pressure at 10 kg cm$^2$ to obtain a sintered body.

The physical properties of the thus-obtained sintered bodies were measured.

The average pore diameters, densities and the porosities of the cordierite layer and the alumina layer are 3.0 μm, 0.52 μm, 1.8 g/cm$^3$, 2.54 g/cm$^3$, and 32% (vol) and 35% (vol), respectively.

It was observed that an intermediate layer of Al$_2$O$_3$—SiO$_2$—MgO had been formed between the cordierite layer and the alumina layer to a thickness of 0.5 μm. The average pore diameter and the porosity of the porous intermediate layer were 1.5 μm and 42%, respectively. The adhesion between the layers was as high as 1.8 kg/mm$^2$.

On the surface and the back surface of the laminate, a thin-film resistor was formed by printing through a screen of 325 meshes by using a paste which contained 38% of ruthenium oxide particles having an average particle diameter of 16 μm and which had a viscosity of 170 Pa·s. When the laminate was dried, it was fired in air at 850° C. The resistance at this time was 59 Ω/□.

When a high-temperature and high-humidity resistant test was conducted on the multi-layer electronic circuit substrate at this stage at 85° C. and 85% RH (relative humidity), the rate of change in resistance was as low as 0.12%, and it exhibited an excellent stability.

The laminate was then impregnated with a two-part liquid epoxy resin and hardened to obtain a multi-layer electronic circuit substrate. The laminate was placed in vacuo to impregnate with the defoamed resin in vacuo, and then heat set.

On both surfaces of the resin-filled laminate, a BT resin prepreg of 0.05 mm thick as an insulating layer and a copper foil of 18 μm thick were then placed to form a conductive layer on both surfaces of the laminate by vacuum pressing.

The laminate was drilled with a diamond drill 0.40 mm in diameter from both surfaces to the intermediate layers, and conduction was established by electroless copper plating to a thickness of 15 μm. The upper and lower conductive layers were etched to form circuits.

The thus-obtained multi-layer electronic circuit substrate had an 8-layer electronic circuit substrate and the total thickness was as thin as 0.86 mm. The multi-layer circuit substrate had 26 built-in film resistors and 14 built-in film capacitor devices per cm$^2$. That is, the mounting density of the multi-layer electronic circuit substrate was very high.

The heat resistance test was carried out on the multi-layer electronic circuit substrate by repeating a cycle of oil dipping at 20° C. for 30 seconds and at 260° C. for 30 seconds. Even after 500 cycles of oil dipping, a defect such as breaking of wire and separation between substrate layers was not produced.

When a high-temperature and high-humidity life test was conducted on the multi-layer electronic circuit substrate at 85° C. and 85% for 1,000 hours, the rate of change in resistance was as low as 0.18%, and it exhibited an excellent stability.

When the thermal conductivity of the multi-layer circuit substrate was measured by a laser flash test in vacuo, the value of 3.6 W/m·K was obtained. Thus, the heat dissipation was good. On the other hand, a multi-layer electronic circuit produced by bonding the electronic circuit substrates with each other by an organic adhesive tape without providing a porous intermediate layer had a thermal conductivity of 0.9 W/m·K.

Figure 13:
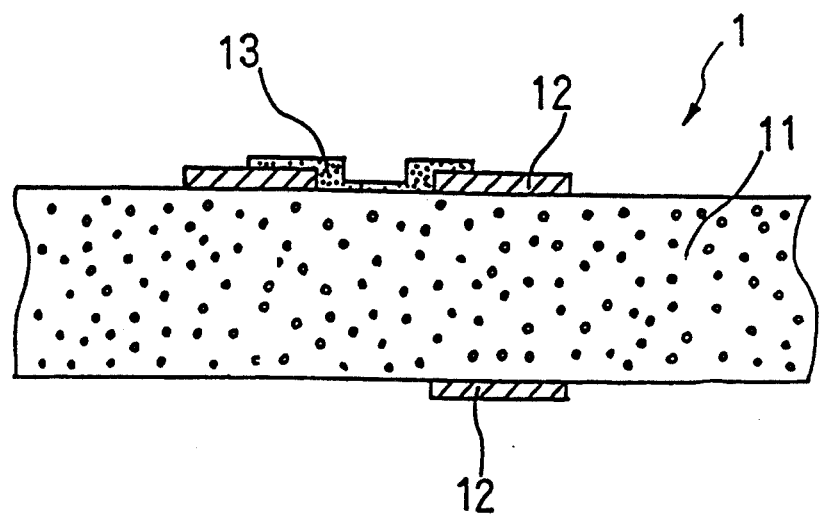

Each of the electronic circuit substrates A and B was produced by firmly bonding the film conductive circuits 12 and the film resistors 13 to the surface and the back surface of the porous ceramic sintered body 11 in close contact therewith, as shown in FIGS. 13 and 14 (the details are described in the tenth embodiment).

For comparison, a porous cordierite sintered body was produced in the same way and was immediately impregnated with a similar two-part liquid epoxy resin. A copper foil was simultaneously laminated, thereby obtaining a substrate. Then, circuits were formed by etching. The peeling strength at this time was as low as 1.8 kg/cm.

The multi-layer electronic circuit substrate allowed not less than 120,000 holes to be formed in an area of 350 mm×250 mm. In this way, the electronic circuit substrate of the present invention had a high strength and an excellent machinability.

Thirteenth Embodiment

A multi-layer electronic circuit substrate was produced by using the same cordierite shaped body (substrate A) and the alumina shaped body (substrate B) in the same way as in the twelfth embodiment except that a tungsten pattern for a conductive circuit was formed on the surfaces thereof by screening printing in place of the gold pattern.

As a result, electric conduction was established on the tungsten particles in the through holes in FIG. 15, although the tungsten particles were un-sintered. The connection reliability and the resistance stability of the multi-layer electronic circuit substrate of this embodiment were good.

Fourteenth Embodiment

A multi-layer electronic circuit substrate was produced by using the same ceramic shaped body as in the twelfth embodiment.

The cordierite shaped body shown in the twelfth embodiment was fired in air at 1,400° C. to produce a porous cordierite sintered body. This sintered body had a thickness of 0.25 mm, a density of 1.8 g cm$^3$, a porosity of 30% and an average porosity diameter of 3.2 μm.

On the surface of the porous cordierite sintered body, a conductive circuit was formed by printing through a screen of 325 meshes by using a paste which contained 48% of silver-palladium particles having an average particle diameter of 11 μm and which had a viscosity of 80 Pa·s. Thereafter, a thin film resistor was formed on the conductor by printing through a screen of 325 meshes by using a paste which contained 38% of ruthenium oxide particles having an average particle diameter of 16 μm and which had a viscosity of 170 Pa·s.

The same alumina shaped body as in the twelfth embodiment was fired in air at 1550° C. for 1 hour to obtain a porous alumina sintered body. The thus-obtained sintered body had a thickness of 0.25 mm, a density of 2.9 g cm$^3$, a porosity of 25% and an average porous diameter of 0.29 μm.

On the surface of the porous alumina sintered body, a conductive circuit was formed by applying thereto the same silver-palladium particles as those used in printing on the surface of the porous cordierite sintered body. Thereafter, a thin film resistor was formed on the conductor by printing through a screen of 325 meshes by using a paste which contained 38% of ruthenium oxide particles having an average particle diameter of 16 μm and which had a viscosity of 170 Pa·s.

Figure 12:
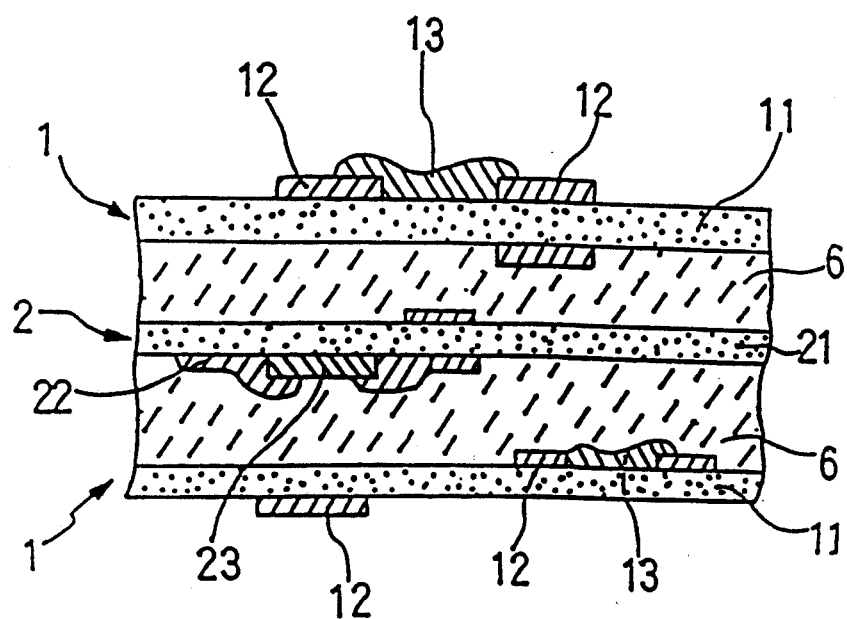
FIGS. 12 through 14 show a multi-layer electronic circuit substrate of Tenth Embodiment.

The sintered bodies were then laminated while placing the porous cordierite sintered bodies in the first and third layers and the porous alumina sintered body in the second layer, as shown in FIG. 12. In order to form a porous intermediate layer, an $Al_2O_3$—$SiO_2$—$TiO_2$ ceramic powder having an average particle diameter of 13 μm was applied to a thickness of about 100 μm between every adjacent layers, and each sintered body was bonded thereto. The laminate was fired in air at 850° C.

The representative resistance at this time was 350 Ω/□. The porous intermediate layer had an average porous diameter of 5.5 μm and a porosity of 33%, and the bonding strength between the sintered bodies was as high as 4.5 kg/mm².

Thereafter, the laminate was impregnated with a two-part liquid epoxy resin and hardened to obtain a multi-layer electronic circuit substrate in the same way as in the twelfth embodiment.

The thus-obtained multi-layer electronic circuit substrate had a 6-layer circuit and the total thickness was as thin as 0.93 mm. The thickness is very thin. The multi-layer circuit substrate had 56 built-in film resistors and 11 built-in film capacitor devices per cm². That is, the mounting density of the multi-layer electronic circuit substrate was very high.

The heat resistance test was carried out on the multi-layer electronic circuit substrate by repeating a cycle of oil dipping at 20° C. for 30 seconds and at 260° C. for 30 seconds. Even after 500 cycles of oil dipping, a defect such as breaking of wire and separation between substrate layers was not produced.

When a high-temperature and high-humidity life test was conducted on the multi-layer electronic circuit substrate at 85° C. and 85% RH for 1,000 hours, the rate of change in resistance was as low as 0.25%, and it exhibited an excellent stability.

The heat releasability was 2.9 W/m·k.

Fifteenth Embodiment

A porous cordierite sintered body provided with circuits and film resistance devices was fired in air at 850° C. in the same manner as Fourteenth Embodiment.

The bonding strength of the circuits obtained was 3 kg, and the representative resistance at this time was 300 Ω/□.

A porous alumina sintered body was produced in the same way as in the fourteenth embodiment. On the surface of the porous alumina sintered body, a film resistor was formed by printing through a screen of 250 meshes by using a paste which contained 41% of lanthanum boride-tin oxide particles having an average particle diameter of 18 μm and which had a viscosity of 110 Pa·s, drying it and firing the sintered body in nitrogen at 900° C.

Thereafter, a conductive circuit was formed on the resistor by printing through a screen of 250 meshes by using a paste which contained 50% of copper particles having an average particle diameter of 8 μm and which had a viscosity of 120 Pa·s.

The sintered bodies were then laminated while placing the porous alumina sintered bodies in the first and third layers and the porous cordierite sintered body in the second layer. In order to form a porous intermediate layer, a $B_2O_3$—$SiO_2$—$ZnO$ glass powder having an average particle diameter of 18 μm was applied to a thickness of about 50 μm between every adjacent layer, and each sintered body was bonded thereto. The laminate was fired in nitrogen at 600° C.

The porous intermediate layer had an average porous diameter of 7.1 μm and a porosity of 21%, and the bonding strength between the sintered bodies was as high as 6.9 kg/mm².

Thereafter, the laminate was impregnated with a two-part liquid epoxy resin and hardened to obtain a multi-layer electronic circuit substrate in the same way as in the twelfth embodiment. The thus-obtained multi-layer electronic circuit substrate had a 6-layer circuit and the total thickness was as thin as 0.83 mm. The thickness is very thin. The multi-layer circuit substrate had 61 built-in film resistor and 26 built-in film capacitor devices per cm². That is, the mounting density of the multi-layer electronic circuit substrate was very high.

The heat resistance test was carried out on the multi-layer electronic circuit substrate by repeating a cycle of oil dipping at 20° C. for 30 seconds and at 260° C. for 30 seconds. Even after 500 cycles of oil dipping, a defect such as breaking of wire and separation between substrate layers was not produced.

When a high-temperature and high-humidity life test was conducted on the multi-layer electronic circuit substrate at 85° C. and 85% RH for 1,000 hours, the rate of change in resistance was as low as 0.41 in ruthenium oxide and 1.18% in lanthanum boride-tin oxide. The heat dissipation was 2.3 W/m·k.

Sixteenth Embodiment

An embodiment of a multi-layer electronic circuit substrate of the present invention will now be explained with reference to FIGS. 16 through 21.

Figure 16:
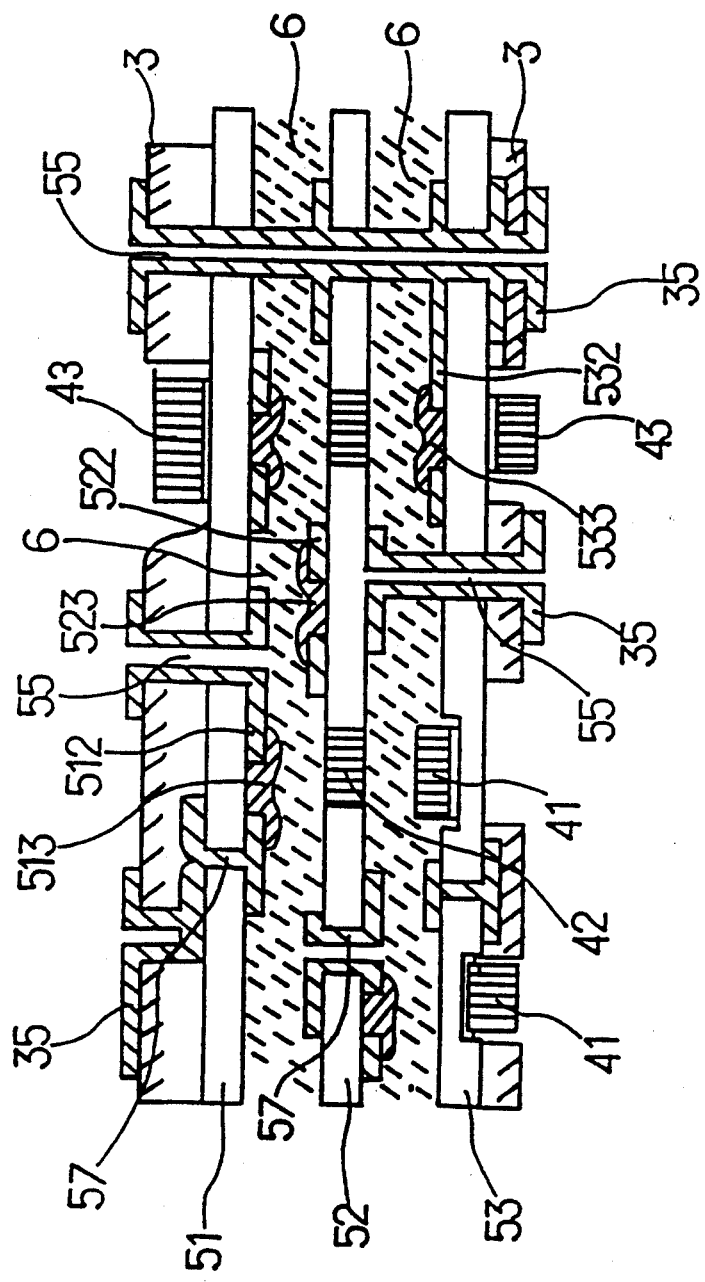
FIG. 16 through 21 show a multi-layer electronic circuit substrate of Sixteenth Embodiment.

The multi-layer electronic circuit substrate is produced by laminating electronic circuit substrates 51, 53 on and beneath a center electronic circuit substrate 52, bonding these substrates into one substrate with a porous intermediate layer 6 therebetween, and forming conductive layers 35 on the upper and lower surfaces thereof through insulating layers 3, thereby making an 8-layer circuit, as shown in FIG. 16. Each electronic circuit has radiators, as will be described in the following.

Figure 17:
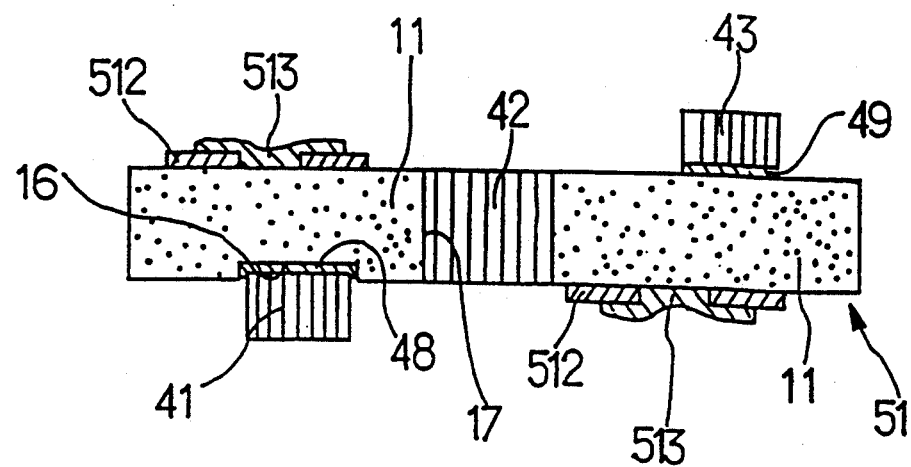

The electronic circuit substrate 51 is produced by providing film conductive circuits 512 and a film resistor 513 on both the surface and the back surface of a porous ceramic sintered body 11 as a substrate in close contact therewith, as shown in FIG. 17. A recessed portion 16 is provided on the back surface of the sintered body 11 by spot facing, and a metal radiator 41 is bonded to the recessed portion 16 through a glass adhesive 48. To an opening 17 of the sintered body 11, a ceramic radiator 42 is bonded. To the surface side of the porous sintered body 11, a metal radiator 43 is bonded through a metal adhesive 49.

Figure 18:
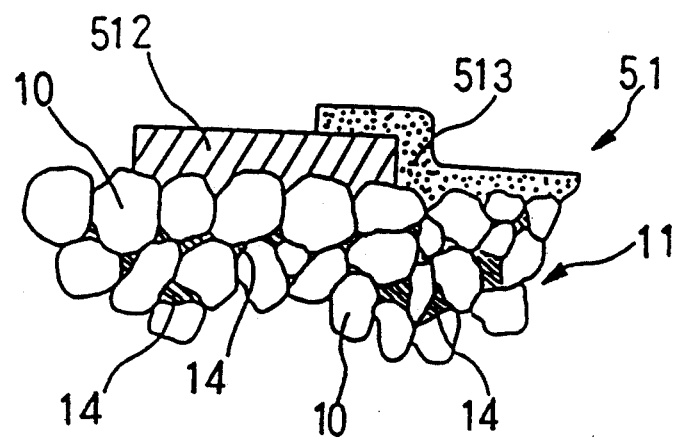

The under surfaces of the film conductive circuit 512 and the film resistor 513 are fitted into the uneven surface portion among a multiplicity of ceramic particles 10 which constitute the porous ceramic sintered body 11 in close contact therewith in a wedged state, as shown in FIG. 18.

Figure 19:
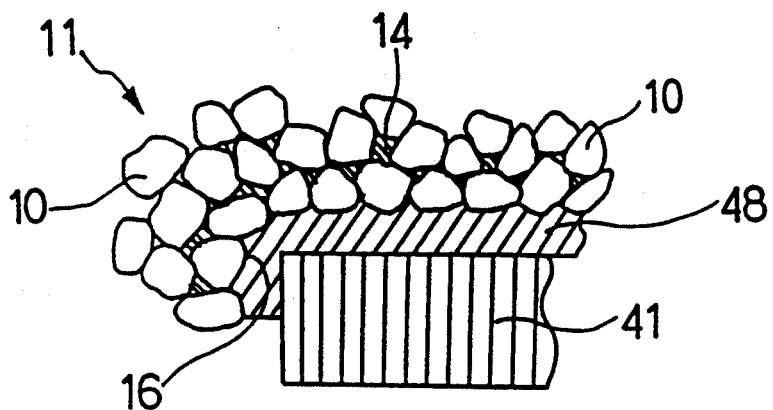

As shown in FIG. 19, the adhesive 48 for bonding the metal radiator 41 is also bonded with the porous ceramic sintered body 11 in close contact therewith among the ceramic particles 10 in a wedged state.

Figure 20:
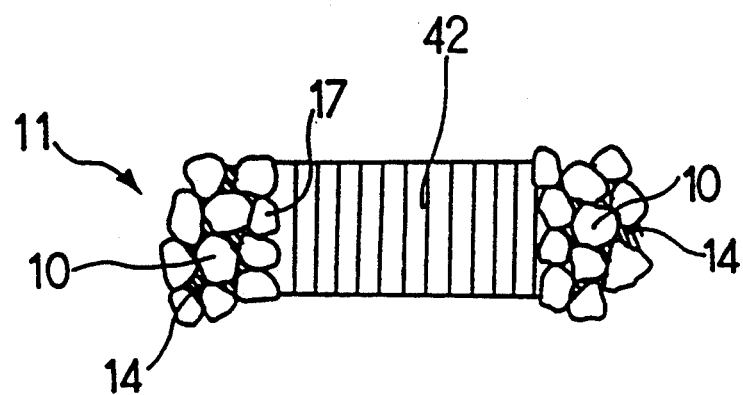

Furthermore, the side surfaces of the ceramic radiator 42 are also fitted among the ceramic particles 10 of the opening 17 in close contact therewith in a wedged state, as shown in FIG. 20.

Figure 21:
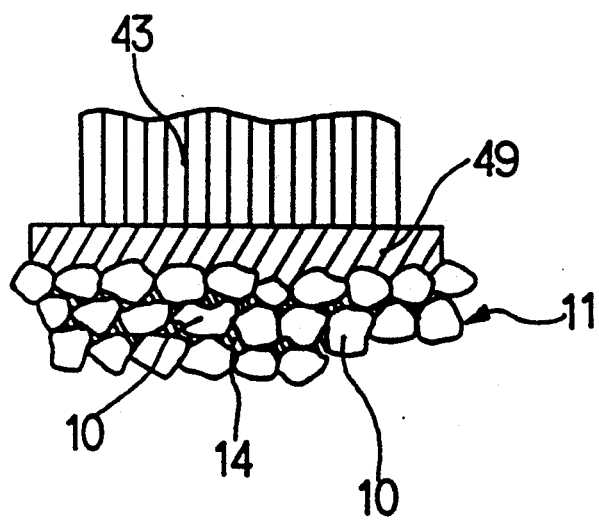

In addition, the adhesive 49 for bonding the metal radiator 43 is bonded with the porous ceramic sintered body 11 among the ceramic particles 10 in close contact therewith in a wedged state as shown in FIG. 21.

In the interior of the porous ceramic sintered body 11, the pore formed among the ceramic particles 10 are filled with a resin 14 with which the sintered body 11 has been impregnated after the lamination (see FIG. 18). The pores of the porous intermediate layers 6 are also filled with the resin.

The other electronic circuit substrates 52 and 53 are the same as the electronic circuit substrate 51. That is, the electronic circuit substrates 51, 52 and 53 are provided with the film conductive circuits 512, 522 and 532, respectively, and the film resistors 513, 523 and 533, respectively, on the surfaces thereof. Each of the electronic circuit substrates has the radiators, as described above. The electronic circuit substrates 51, 52 and 53 are provided with through holes 55 conductive between substrates and 57 conductive in a substrate between the film conductive circuits and the film resistors.

The porous intermediate layer 6 is interposed between every adjacent layers of the electronic circuit substrates 51, 52 and 53. The porous intermediate layer 6 is composed of a ceramic material.

Since the multi-layer circuit substrate is impregnated with a resin by dipping the whole laminate into a molten resin after the lamination, the surface thereof is coated with the resin.

In the multi-layer circuit substrate of this embodiment, film devices and radiators are bonded to each electronic circuit substrate which constitutes the multi-layer circuit substrate in close contact therewith, and a porous intermediate layer having a high heat transfer efficiency is interposed between every adjacent electronic circuit substrate. The pores of the porous ceramic sintered body are filled with a resin. Therefore, the multi-layer electronic circuit substrate is excellent in high-humidity resistance, high-temperature resistance, heat dissipation and machinability and has a high reliability.

Seventeenth Embodiment

A multi-layer electronic circuit substrate having an 8-layer circuit (see FIG. 16) which is similar to the sixteenth embodiment was produced and various tests were carried thereon.

The multi-layer circuit substrate was produced by first producing an electronic circuit substrate A and electronic circuit substrates B and laminating the electronic circuit substrates B on and beneath the electronic circuit substrate A.

In order to produce the electronic circuit substrate A, 2 parts by weight of polyvinyl alcohol, 1 part by weight of polyethylene glycol, 0.5 part by weight of stearic acid and 100 parts by weight of water were added to 100 parts by weight of cordierite powder having an average particle diameter of 1.8 μm, and after they were mixed in a ball mill for 3 hours, the mixture was spray dried.

An appropriate amount of dried mixture was collected and molded under a pressure of 1.0 t/cm² by using a metal die, thereby obtaining a ceramic green shaped body 220 mm × 250 mm × 1.2 mm in size and 1.5 g/cm³ in density (60 vol %).

The green shaped body was punched to form an opening of 20×20 mm.

In order to produce the radiator 42 (see FIG. 17), 12 parts by weight of polyacrylic acid ester, 1 part by weight of polyester dispersant, 2 parts by weight of dibutyl phthalate and 50 parts by weight of ethyl acetate were added to 100 parts by weight or alumina powder having an average particle diameter of 0.30 μm, and after they were mixed in a ball mill for 3 hours, the mixture was sheet formed to obtain a green shaped body. The green shaped body was fired in air at 1650° C. to obtain a dense alumina sintered body having a density of 4.02 g/cm³ and a porosity of 0.2%. The alumina sintered body was cut into a piece of 19.2×19.2 mm to obtain the radiator 42. The radiator 42 was mounted on the opening 17 of the cordierite green shaped body (see FIG. 17).

The cordierite green shaped body was then fired in air at 1400° C. to produce a porous cordierite sintered body.

The thus-obtained porous cordierite sintered body had a thickness of 0.25 mm, a density of 1.8 g/cm³, a porosity of 30% and an average porous diameter of 3.2 μm.

The bonding strength between the radiator consisting of the dense alumina sintered body and the porous cordierite sintered body was as strong as 8.9 kg/mm².

On the surface of the porous cordierite sintered body, a conductive circuit was formed by printing through a screen of 325 meshes by using a paste which contained 48% of silver-palladium particles having an average particle diameter of 11 μm and which had a viscosity of 80 Pa·s. Thereafter, a thin film resistor was formed on the conductor by printing through a screen of 325 meshes by using a paste which contained 38% of ruthenium oxide particles having an average particle diameter of 16 μm and which had a viscosity of 170 Pa·s.

In this way, the electronic circuit substrate A was produced.

In order to produce the electronic circuit substrate B, 50 parts by weight of alumina powder having an average particle diameter of 0.32 μm, 12 parts by weight of polyacrylic acid ester, 1 part by weight of polyester dispersant, 2 parts by weight of dibutyl phthalate and 50 parts by weight of ethyl acetate were added to 50 parts by weight of alumina powder having an average particle diameter of 0.68 μm, and after they were mixed in a ball mill for 3 hours, the mixture was sheet formed.

The green shaped body was spot faced to form the recessed portion 16 (see FIG. 17) 20×20×0.2 mm in size.

The green shaped body was fired in air at 1550° C. for 1 hour to obtain a porous alumina sintered body.

The thus-obtained sintered body had a thickness of 0.45 mm, a density of 2.9 g/cm³, a porosity of 25% and an average porous diameter of 0.29 μm.

On the surface of the porous alumina sintered body, a conductive circuit was formed by applying thereto the same silver-palladium particles as those used in printing on the surface of the porous cordierite sintered body. Thereafter, a thin film resistor was formed on the conductor by printing through a screen of 325 meshes by using a paste which contained 38% of ruthenium oxide particles having an average particle diameter of 16 μm and which had a viscosity of 170 Pa·s.

A $K_2O$—$SiO_2$—$PbO$ glass powder having an average particle diameter of 13 μm was placed in the recessed portion 16 of the porous alumina sintered body to a thickness of 30 m as an adhesive, and a 42 alloy plate (nickel-iron alloy) was placed on the glass powder as the radiator 41 (see FIG. 17) and heated and fixed. The surface of the 42 alloy plate had been roughened in advance by chromic acid.

In this way, the electronic circuit substrates B were produced.

The electronic circuit substrate A (second layer) consisting of the porous cordierite sintered body and the electronic circuit substrates B (first and third layers) consisting of the porous alumina sintered body were laminated into three layers, as shown in FIG. 16.

In order to form the porous intermediate layer 6 (see FIG. 16), an $Al_2O_3$—$SiO_2$—$TiO_2$ ceramic powder having an average particle diameter of 13 μm was applied to a thickness of about 100 μm between every adjacent layers, and each sintered body was bonded thereto. The laminate was fired in air at 820° C. The representative resistance at this time was 350 Ω/□.

As a result, the bonding strength between the radiators bonded to the porous alumina sintered bodies B at the first and third layers through the glass and the porous alumina sintered body B was 4.3 kg/mm$^2$ and the porosity of the adhesive layer was 13%.

The porous intermediate layer 6 had an average porous diameter of 5.0 μm and a porosity of 35%, and the bonding strength between the sintered bodies was as high as 2.5 kg/mm$^2$.

Thereafter, in order to bond radiator plates to the laminate, twenty-five square 95% Sn-5% P solders each having a size of 2×2 mm were placed on both surfaces of the laminate in the form of a square of 14×14 mm by arranging five solders for every vertical and horizontal line. A radiating copper plate of 15×15×1 mm was mounted on the soldered surfaces and heated at 260° C. for bonding. The bonding strength was 12 kg/mm$^2$, and the solder had a porosity of about 6%.

On both surfaces of the laminate, a BT resin prepreg of 0.05 mm thick and a copper foil of 18 μm thick were then placed to form a conductive layer on both surfaces of the laminate by vacuum pressing.

The laminate was drilled with a diamond drill 0.40 mm in diameter from both surfaces to the intermediate layers, and conduction was established by electroless copper plating to a thickness of 15 μm. The upper and lower conductive layers were etched to form circuits.

The laminate was impregnated with a two-part liquid epoxy resin and hardened to obtain a multi-layer electronic circuit substrate. The laminate was placed in vacuo to impregnate with the defoamed resin in vacuo, and then heat set.

The thus-obtained multi-layer electronic circuit substrate had an 8-layer circuit and the total thickness was as thin as 1.55 mm. The thickness is very thin. The multi-layer circuit substrate had 35 built-in film resistors and 8 built-in film capacitor devices per cm$^2$. That is, the mounting density of the multi-layer electronic circuit substrate was very high.

The total thermal conductivity of the multi-layer electronic circuit substrate was 8 W/m·k, which means that the multi-layer electronic circuit substrate was very excellent in heat dissipation.

The heat resistance test was carried out on the multi-layer electronic circuit substrate by repeating a cycle of oil dipping at 20° C. for 30 seconds and at 260° C. for 30 seconds. Even after 500 cycles of oil dipping, a defect such as breaking of wire, separation between substrate layers and the separation of a radiator was not produced.

When a high-temperature and high-humidity life test was conducted on the multi-layer electronic circuit substrate at 85° C. and 85% RH for 1,000 hours, the rate of change in resistance was as low as 0.18%, and it exhibited an excellent stability.

Each of the electrode circuit substrates A and B allowed not less than 120,000 holes to be formed in an area of 350mm×250 mm. In this way, the electronic circuit substrate of the present invention had a high strength and an excellent machinability.

A multi-layer electronic circuit substrate similar to the seventeenth embodiment was produced for comparison in the same way as in the seventeenth embodiment except for bonding the radiators with the porous ceramic sintered bodies merely by an immersed resin without either directly bonding them or bonding them by a metal or an inorganic material. The total thermal conductivity was 2.6 W/m·k.

The total thermal conductivity thereof was 0.9 W/m·k when the radiators were not used. In both cases, the heat dissipation was inferior to that of the seventeenth embodiment.

For further comparison, a porous cordierite sintered body was produced in the same way as in the second embodiment and was immediately impregnated with a similar two-part liquid epoxy resin. A copper foil was simultaneously laminated, thereby obtaining a substrate. Then, circuits were formed by etching. The peeling strength at this time was as low as 1.8 kg/cm.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. An electronic circuit substrate comprising:
   a porous ceramic sintered body with film devices directly formed on a surface thereof;
   a resin filled in the pores of said porous ceramic sintered body;
   wherein a bottom surface of said film devices are fit into the pores and recesses on the surface of said porous ceramic sintered body in close contact therewith in a wedged state; and
   wherein said porous ceramic sintered body has an average pore diameter of 0.2 to 15 μm and a porosity of not less than 10 vol %.

2. An electronic circuit substrate according to claim 1, wherein a plurality of said electronic circuit substrates are prepared and laminated together through insulating layers.

3. An electronic circuit substrate according to claim 1, wherein a radiator adheres to a surface of said porous ceramic sintered body.

4. An electronic circuit substrate comprising:
   a porous ceramic sintered body with film devices directly formed on a surface thereof;
   a resin filled in the pores of said porous ceramic sintered body;
   wherein a bottom surface of said film devices are fit into the pores and recesses on the surface of said porous ceramic sintered body in close contact therewith in a wedged state;
   wherein a plurality of said electronic circuit substrates are prepared and laminated together through at least one insulating layer; and
   wherein an other insulating layer is formed on a surface of one of said plurality of electronic circuit substrates and a conductive layer is formed on said other insulating layer.

5. An electronic circuit substrate comprising:
a porous ceramic sintered body with film devices directly formed on a surface thereof;
a resin filled in the pores of said porous ceramic sintered body;
wherein a bottom surface of said film devices are fit into the pores and recesses on the surface of said porous ceramic sintered body in close contact therewith in a wedged state;
wherein a plurality of said electronic circuit substrates are prepared and laminated together through at least one insulating layer; and
wherein said at least one insulating layer is composed of a resin or a composite material of a resin and an inorganic material.

6. An electronic circuit substrate comprising:
a porous ceramic sintered body with film devices directly formed on a surface thereof;
a resin filled in the pores of said porous ceramic sintered body;
wherein a bottom surface of said film devices are fit into the pores and recesses on the surface of said porous ceramic sintered body in close contact therewith in a wedged state; and
wherein a plurality of said electronic circuit substrates are prepared and bonded with each other into a laminate through a porous intermediate layer and the pores of said porous intermediate layer are filled with a resin.

7. An electronic circuit substrate according to claim 6, wherein a radiator adheres to a surface of said porous ceramic sintered body.

8. An electronic circuit substrate comprising:
a porous ceramic sintered body with film devices directly formed on a surface thereof;
a resin filled in the pores of said porous ceramic sintered body;
wherein a bottom surface of said film devices are fit into the pores and recesses on the surface of said porous ceramic sintered body in close contact therewith in a wedged state;
wherein a plurality of said electronic circuit substrates are prepared and laminated together through at least one insulating layer; and
wherein a radiator adheres to a surface of said porous ceramic sintered body.

9. A method of producing an electronic circuit substrate comprising the steps of:
forming film devices directly on a surface of a porous ceramic sintered body, wherein said porous ceramic sintered body has an average pore diameter of 0.2 to 15 μm and a porosity of not less than 10 vol %; and,
filling the pores of said porous ceramic sintered body with a resin so as to fit an under surface of said film devices into the pores and recesses on the surface of said porous ceramic sintered body in close contact therewith in a wedge state.

10. A method of producing an electronic circuit substrate according to claim 9 wherein said film devices are formed on a surface of said porous ceramic sintered body by first applying a paste for constituting the film devices to a surface of a green shaped body of a ceramic material and then firing said green ceramic shaped body at a temperature for forming a sintered body.

11. A method of producing an electronic circuit substrate according to claim 9, wherein said film devices are formed on a surface of said porous ceramic sintered body by first applying a paste for constituting the film devices to a surface of a porous ceramic sintered body and then heating said porous ceramic sintered body.

12. A method of producing an electronic circuit substrate according to claim 9, wherein said film devices are formed on a surface of said porous ceramic sintered body by masking a surface of said porous ceramic sintered body except portions which constitute a circuit, forming the film devices by deposition or sputtering, and removing the mask.

13. A method of producing an electronic circuit substrate according to claim 9, wherein the pores of said porous ceramic sintered body are filled with a resin by dipping a porous ceramic sintered body having said film devices provided thereon into a hot-molten resin.

14. A method of producing an electronic circuit substrate according to claim 9, wherein the pores of said porous ceramic sintered body are filled with a resin by impregnating a porous ceramic sintered body with a monomer state resin and polymerizing said monomer state resin.

15. A method of producing an electronic circuit substrate according to claim 9, further comprising the steps of:
preparing a plurality of said electronic circuit substrates; and,
bonding the plurality of said electronic circuit substrates with each other into a laminate through an insulating layer, thereby producing a multi-layer electronic circuit substrate.

16. A method of producing an electronic circuit substrate according to claim 15, wherein a radiator adheres to a surface of said porous ceramic sintered body.

17. A method of producing an electronic circuit substrate according to claim 9, wherein a radiator adheres to a surface of said porous ceramic sintered body.

18. A method of producing an electronic circuit substrate comprising the steps of:
forming film devices directly on a surface of a porous ceramic sintered body;
filling the pores of said porous ceramic sintered body with a resin so as to fit an under surface of said film devices into the pores and recesses on the surface of said porous ceramic sintered body in close contact therewith in a wedge state;
preparing a plurality of said electronic circuit substrates; and,
bonding the plurality of said electronic circuit substrates with each other into a laminate through an insulating layer, thereby producing a multi-layer electronic circuit substrate;
wherein an other insulating layer is formed on a surface of an outermost electronic circuit substrate and a conductive layer is formed on said other insulating layer.

19. A method of producing an electronic circuit substrate comprising the steps of:
forming film devices directly on a surface of a porous ceramic sintered body; and,
filling the pores of said porous ceramic sintered body with a resin so as to fit an under surface of said film devices into the pores and recesses on the surface of said porous ceramic sintered body in close contact therewith in a wedge state;

wherein said film devices are first formed directly on a surface of said porous ceramic sintered body, a plurality of said porous ceramic sintered bodies are laminated, and the pores of the plurality of said porous ceramic sintered bodies are filled with a resin.

20. A method of producing an electronic circuit substrate according to claim 19, wherein a plurality of said porous ceramic sintered bodies are bonded with each other into a laminate through an insulating layer.

21. A method of producing an electronic circuit substrate according to claim 19, wherein a plurality of said porous ceramic sintered bodies are bonded with each other into a laminate through a porous intermediate layer and the pores of said porous intermediate layer are filled with a resin.

22. A method of producing an electronic circuit substrate according to claim 21, wherein a radiator adheres to a surface of said porous ceramic sintered body.

* * * * *